(12) United States Patent  (10) Patent No.: US 8,013,574 B2
Naganuma et al.  (45) Date of Patent: Sep. 6, 2011

(54) DISCHARGE CONTROLLER

(75) Inventors: Atsuhiro Naganuma, Wako (JP);
Shintaro Uchida, Wako (JP)

(73) Assignee: Honda Motor Co., Ltd., Tokyo (JP)

( * ) Notice: Subject to any disclaimer, the term of this patent is extended or adjusted under 35 U.S.C. 154(b) by 78 days.

(21) Appl. No.: 12/256,717

(22) Filed: Oct. 23, 2008

(65) Prior Publication Data

US 2009/0102422 A1 Apr. 23, 2009

(30) Foreign Application Priority Data

Oct. 23, 2007 (JP) ................................ 2007-275171

(51) Int. Cl.
*H02J 7/00* (2006.01)
(52) U.S. Cl. ........................................ 320/118; 320/135
(58) Field of Classification Search .................. 320/118, 320/135
See application file for complete search history.

(56) References Cited

U.S. PATENT DOCUMENTS

| | | | |
|---|---|---|---|
| 5,498,950 | A | 3/1996 | Ouwerkerk |
| 6,064,178 | A * | 5/2000 | Miller ............................ 320/117 |
| 6,239,579 | B1 | 5/2001 | Dunn et al. |
| 6,984,961 | B2 * | 1/2006 | Kadouchi et al. ............. 320/132 |
| 7,091,700 | B2 * | 8/2006 | Kadouchi et al. ............. 320/132 |
| 7,193,392 | B2 * | 3/2007 | King et al. ..................... 320/118 |
| 7,332,244 | B2 | 2/2008 | Uemoto et al. |
| 2003/0064283 | A1 | 4/2003 | Uemoto et al. |
| 2003/0146737 | A1 | 8/2003 | Kadouchi et al. |
| 2004/0135546 | A1 * | 7/2004 | Chertok et al. ................ 320/118 |
| 2009/0115372 | A1 | 5/2009 | Naganuma et al. |

FOREIGN PATENT DOCUMENTS

| | | |
|---|---|---|
| GB | 2372645 A | 8/2002 |
| JP | 08-019188 A | 1/1996 |
| JP | 2003-109655 A | 4/2003 |
| JP | 2003-164069 A | 6/2003 |
| JP | 2006-50716 A | 2/2006 |
| JP | 2007-14148 A | 1/2007 |

OTHER PUBLICATIONS

European Search Report dated May 14, 2009, issued in corresponding European Patent Application No. 08166790.9.
Japanese Office Action dated Oct. 30, 2009, issued in corresponding Japanese Patent Application No. 2007-275171.

* cited by examiner

*Primary Examiner* — Edward Tso
*Assistant Examiner* — Ramy Ramadan
(74) *Attorney, Agent, or Firm* — Westerman, Hattori, Daniels & Adrian, LLP

(57) ABSTRACT

There is provided a discharge controller for a multiple cell battery that has a plurality of storage cells connected in series with each other. A discharge path from the storage cell is connected a load. The discharge controller includes: cell voltage detection units for detecting respective cell voltages of the storage cells; a switch group comprising a plurality of switches each connected between the storage cells; and a control unit for performing ON/OFF control on the respective switches individually in response to detection results detected by the cell voltage detection units so as to form the discharge path from the storage cell to the load.

13 Claims, 25 Drawing Sheets

FIG.4 cell voltage range: 2.5 to 4 V
underlined portion: not satisfied

| average cell voltage (average value of maximum cell) | Number of cells | total voltage (same voltage in all cells) | maximum cell voltage | total voltage (containing one maximum cell) |
|---|---|---|---|---|
| average 4.0 V | two cells <br> three cells <br> four cells | <u>8.0V</u> <br> 12.0V <br> <u>16.0V</u> | 4.1V | <u>8.1V</u> <br> 12.1V <br> <u>16.1V</u> |
| average 3.5 V | two cells <br> three cells <br> four cells | <u>7.0V</u> <br> 10.5V <br> <u>14.0V</u> | 3.6 | <u>7.1V</u> <br> 10.6V <br> <u>14.1V</u> |
| average 3.0 V | two cells <br> three cells <br> four cells <br> five cells | <u>6.0V</u> <br> 9.0V <br> 12.0V <br> <u>15.0V</u> | 3.1V | <u>6.1V</u> <br> 9.1V <br> 12.1V <br> <u>15.1V</u> |
| average 2.5 V | three cells <br> four cells <br> five cells <br> six cells | <u>7.5V</u> <br> 10.0V <br> 12.5V <br> <u>15.0V</u> | 2.6V | <u>7.6V</u> <br> 10.1V <br> 12.6V <br> <u>15.1V</u> | selectable ↔ selectable ↔

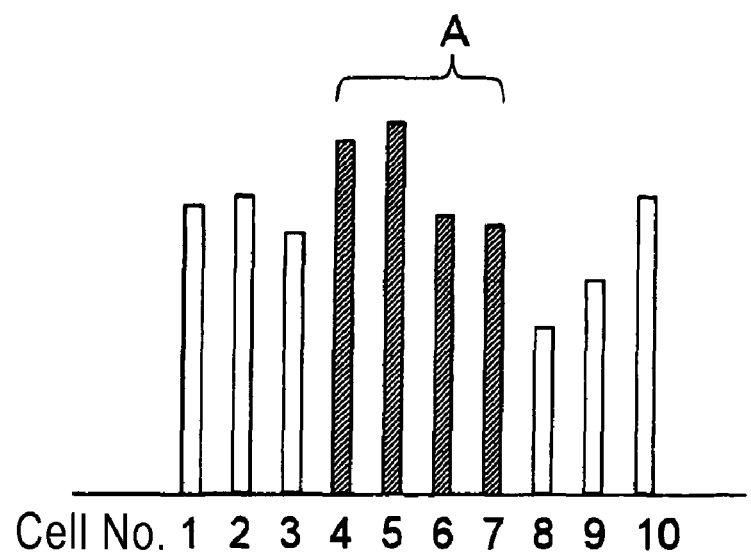
FIG.10A
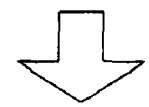
FIG.10B
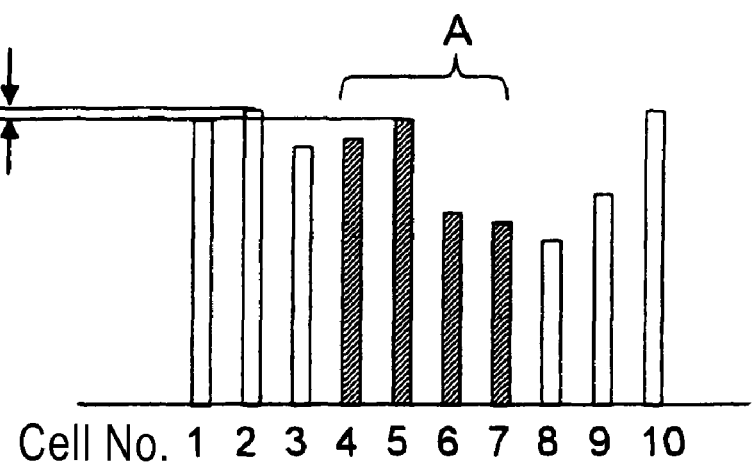
FIG.10C
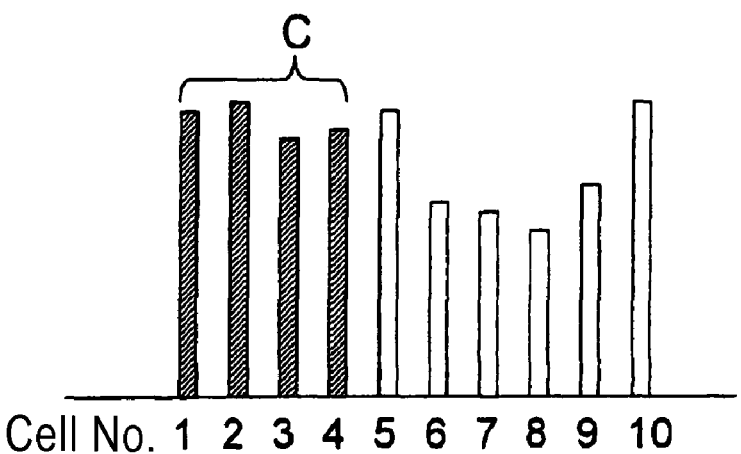

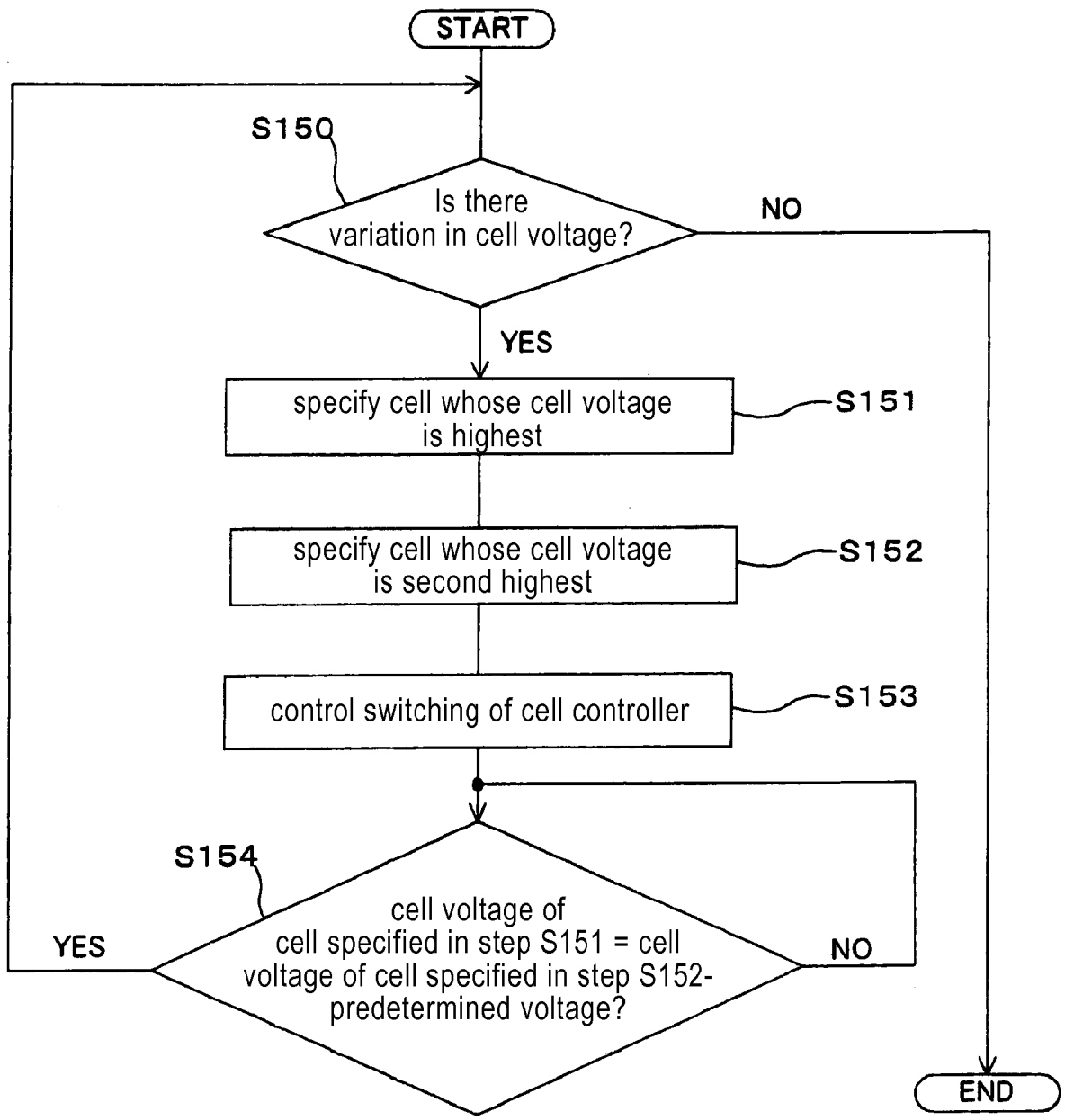

DISCHARGE CONTROLLER

This application claims priority from Japanese Patent Application No. 2007-275171 filed on Oct. 23, 2007, the entire contents of which are hereby incorporated by reference.

BACKGROUND OF THE INVENTION

1. Technical Field

The present disclosure relates to a discharge controller for controlling a discharge from a plurality of storage cells in a multiple cell battery to equalize remaining electricity storages in the storage cells.

2. Related Art

In the vehicle such as Electric Vehicle (EV), Hybrid Electrical Vehicle (HEV), or the like, the multiple cell battery for feeding an electric power to a motor is installed, and a plurality of storage cells connected in series with each other are provided in the multiple cell battery.

FIG. 23 is a block diagram showing a relationship between a multiple cell battery installed in the vehicle, a part of an electric drive system, and accessories. The vehicle shown in FIG. 23 is equipped with a multiple cell battery 10, an inverter 11, a motor 13, a DC-DC converter 15, a battery 17, and an electric motor 19 for a cooling fan (referred to as an "electric motor" hereinafter). An output voltage of the multiple cell battery 10 is a high voltage (e.g., 100 to 200 V), and an output voltage of the battery 17 is a voltage for the accessories (e.g., low voltage of 12V). The output voltage of the multiple cell battery 10 is converted from DC to AC by the inverter 11, and then is fed to the motor 13. Also, the output voltage of the multiple cell battery 10 is stepped down by the DC-DC converter 15, and then charges the battery 17. An electric power is supplied from the battery 17 to the electric motor 19. An airflow is generated by the cooling fan driven by the electric motor 19, and cools the multiple cell battery 10.

The multiple cell battery 10 shown in FIG. 23 includes a plurality of storage cells C1 to Cm (m is an integer of 2 or more) connected in series with each other (simply referred to as "cells" hereinafter), discharge switch units Cc1 to Ccm connected in parallel with the cells respectively, voltage detection units S1 to Sm connected in parallel with the cells respectively, and a control unit 21 for controlling respective discharge switch units. In this case, the discharge switch units Cc1 to Ccm, the voltage detection units S1 to Sm, and the control unit 21 are integrated and formed on an IC chip.

Each discharge switch unit has a discharge resistor R and a switch Sw connected in series. The voltage detection units S1 to Sm detect a voltage across the cell (cell voltage) among the series-connected cells respectively. The control unit 21 controls ON/OFF of the switches in respective discharge switch units, in response to the result decided by the voltage detection units S1 to Sm.

Also, the multiple cell battery 10 has a charge control unit (not shown). The charge control unit performs the control to prevent an overcharge of each cell (overcharge preventing control), in charging the multiple cell battery 10. There is a variation in cell voltages of the cells depending on application conditions of the multiple cell battery 10, qualities of the cells, and the like. Therefore, the charge control unit executes the overcharge preventing control to meet the cell having the highest cell voltage. As the cells of the multiple cell battery 10, a lithium-ion battery, a nickel-hydrogen battery are employed, for example. In this case, this overcharge preventing control is particularly needed in employing the lithium-ion battery.

In this manner, the overcharge preventing control of the multiple cell battery 10 is applied based on the cell having the highest cell voltage. Therefore, as shown in FIG. 24, when a variation in cell voltages is increased due to repetition of the charge/discharge operation, a reduction in capacity of the multiple cell battery 10 is brought about. That is, the remaining electricity storage of the overall multiple cell battery 10 is restricted by the overcharge preventing control applied in charging the multiple cell battery 10. As a result, as indicated with a dotted line in FIG. 24, a capacity of the multiple cell battery 10 is lowered. When a sufficient electric power cannot be fed to the motor 13 because a capacity of the multiple cell battery 10 is lowered, either the cells of the multiple cell battery 10 must be equipped much more or the multiple cell battery 10 must be replaced with another multiple cell battery having a larger capacity.

For this reason, in the multiple cell battery 10 shown in FIG. 23, the control unit 21 controls individually the switches of respective discharge switch units such that cell voltages of the cells are kept at the same level. For example, as shown in FIG. 25, when the cell voltage of the cell C1 is higher than the cell voltages of the other cells C2 to Cm, the control unit 21 turns ON the switch Sw1 of the discharge switch unit Cc1 corresponding to the cell C1, and closes the circuit consisting of the cell C1 and a discharge resistor R1. At this time, a current flows to the discharge resistor R1 from the cell C1, and this current is converted into a heat by the discharge resistor R1. As a result, the cell voltage of the cell C1 is lowered, and the control unit 21 turns OFF a switch Sw1 when the cell voltage of the cell C1 is set at the same level as the cell voltages of the cells C2 to Cm. In this manner, a variation in cell voltages is reduced by equalizing the cell voltages of the cells, and therefore a reduction in capacity of the multiple cell battery 10 can be prevented (see e.g., JP-A-8-19188 and JP-A-2003-164069).

In the multiple cell battery 10 explained above, a heat is generated along with the equalization of the cell voltages of the cells. That is, in the multiple cell battery 10, an electric power accumulated in the cells is consumed wastefully by the equalization of the cell voltages of the cells. Also, as described above, the integrated circuit consisting of the discharge switch units Cc1 to Ccm, the voltage detection units S1 to Sm, and the control unit 21 is provided in the multiple cell battery 10. Since the constituent elements whose characteristics are varied depending on the ambient temperature are contained in the integrated circuit, it is advantageous that an amount of heat generated in the discharge resistors R1 to Rm should be made small.

According to the Joule's law, an amount of heat generated in the resistor is proportional to "$current^2 \times resistance\ value$". Therefore, the resistor having a large resistance value is employed as the discharge resistors R1 to Rm. When a resistance value the discharge resistor is large, a discharge current becomes small, so that a quantity of heat generated by the discharge resistor is reduced. However, when the discharge current is small, a time required for the equalization of the cell voltages of the cells is prolonged. As a result, the resistance value of the discharge resistors R1 to Rm is decided in consideration of the balance between a quantity of heat generated by the discharge resistor and an equalizing time for the cell voltages. In any event, a heat is generated from the discharge resistors R1 to Rm along with the equalization of the cell voltages of the cells. Therefore, high-level heat measures such as thermal diffusion, heat resistance, etc. must be applied to the multiple cell battery 10 such that the integrated circuit is not affected by such heat.

SUMMARY OF THE INVENTION

Exemplary embodiments of the present invention address the above disadvantages and other disadvantages not described above. However, the present invention is not required to overcome the disadvantages described above, and thus, an exemplary embodiment of the present invention may not overcome any of the problems described above.

Accordingly, it is an aspect of the present invention to provide a discharge controller capable of consuming effectively an energy accumulated in a multiple cell battery.

According to one or more aspects of the present invention, there is provided a discharge controller for a multiple cell battery that has a plurality of storage cells connected in series with each other. A discharge path from the storage cell is connected a load. The discharge controller includes: cell voltage detection units for detecting respective cell voltages of the storage cells; a switch group comprising a plurality of switches each connected between the storage cells; and a control unit for performing ON/OFF control on the respective switches individually in response to detection results detected by the cell voltage detection units so as to form the discharge path from the storage cell to the load.

According to one or more aspects of the present invention, the storage cells are lithium-ion storage cells.

According to one or more aspects of the present invention, the switch group includes: a first switch group including a plurality of first switches connected to a minus-side input terminal of the load; and a second switch group including a plurality of second switches connected to a plus-side input terminal of the load. The control unit turns ON any one of the first switches and any one of the second switches so as to form the discharge path from the successive storage cells to the load.

According to one or more aspects of the present invention, the control unit assigns a storage cell whose cell voltage is highest among the storage cells to a first group so as to form a first discharge path from first storage cells assigned to the first group to the load.

According to one or more aspects of the present invention, the control unit selects the first storage cells assigned to the first group such that discharge voltages of the first storage cells assigned to the first group is set within a voltage range in which the load is able to be driven.

According to one or more aspects of the present invention, when another storage cell has the highest cell voltage among the storage cells as a result of discharge from the first storage cells assigned to the first group, the control unit assigns said another storage cell to a second group so as to form a second discharge path from second storage cells assigned to the second group to the load.

According to one or more aspects of the present invention, when one of the first storage cells assigned to the first group is lowest among the storage cells in the multiple cell battery as a result of discharge from the first storage cells assigned to the first group, the control unit assigns another storage cell whose cell voltage is highest among the storage cells in the multiple cell battery to a third group so as to form a third discharge path from third storage cells assigned to the third group to the load.

According to one or more aspects of the present invention, the control unit does not select a group to which a storage cell having the lowest cell voltage among the storage cells in the multiple cell battery is assigned.

According to one or more aspects of the present invention, the switch group includes: a first switch group comprising a plurality of first switches connected to a minus-side input terminal of the load; and a second switch group comprising a plurality of second switches connected to a plus-side input terminal of the load. The control unit turns ON any one of the first switches and any one of the second switches so as to form the discharge path from a storage cell having the highest cell voltage among the storages cells to the load.

According to one or more aspects of the present invention, when the cell voltage of the storage cell is equal to the lowest cell voltage among the storage cells in the multiple cell battery as a result of discharge from the storage cell having the highest cell voltage, the control unit switches from the discharge path to another discharge path.

According to one or more aspects of the present invention, when the cell voltage of the storage cell is equal to a voltage value obtained by subtracting a given value from the second highest cell voltage among the storage cells in the multiple cell battery as a result of discharge from the storage cell having the highest cell voltage, the control unit switches from the discharge path to another discharge path.

According to one or more aspects of the present invention, the cell voltage detection units detects the respective cell voltages of the storage cells continuously or periodically, and the control unit performs the ON/OFF control on the respective switches continuously in response to the detection results.

According to one or more aspects of the present invention, the discharge controller further includes: a voltage converter for stepping up or down discharge voltages from the storage cells and provided on the discharge path.

According to one or more aspects of the present invention, the discharge controller further includes: a resistor provided in parallel with the load.

According to one or more aspects of the present invention, the discharge controller further includes: a switch connected in parallel with the load and connected in series with the resistor. The control unit performs ON/OFF control on the switch in response to the discharge voltages from the storage cells.

According to one or more aspects of the present invention, the discharge controller further includes: a capacitor connected in parallel with the load.

According to one or more aspects of the present invention, the load is a rotary inductive load.

According to one or more aspects of the present invention, the multiple cell battery having the plurality of storage cells is used for feeding an electric power to a motor in an electric vehicle or a hybrid electrical vehicle.

According to the present invention, an electric power discharged from the storage cells to equalize the cell voltages can be utilized to drive the rotary inductive load. Therefore, an energy accumulated in the multiple cell battery can be consumed effectively.

Also, the multiple cell battery is flexibly adaptable to the discharge voltages of the storage cells and the drive voltages for the rotary inductive load.

Also, according to the present invention, even when the discharge voltage from the storage cell does not reach the drive voltage of the rotary inductive load, the cell discharge can be performed through the resistor.

Also, according to the present invention, an electric power can be supplied stably to the rotary inductive load such that the power feed is not so affected by variation in level of the discharge voltage of the storage cell.

Other aspects and advantages of the present invention will be apparent from the following description, the drawings, and the claims.

BRIEF DESCRIPTION OF THE DRAWINGS

FIG. 4 is a table showing relationships among an output voltage of a single cell, a number of discharge cells, a maximum cell voltage, and a discharge voltage;

FIGS. 10A to 10C are views showing an example of cell voltages of the cells in the multiple cell battery 100 of the first embodiment;

FIG. 17 is a flowchart showing discharge control executed by a control unit of a multiple cell battery of a third embodiment;

DETAILED DESCRIPTION OF EXEMPLARY EMBODIMENTS OF THE INVENTION

Exemplary embodiments of the present invention will be described with reference to the drawings hereinafter. A multiple cell battery of the embodiment described hereinafter is installed into the vehicle such as Electric Vehicle (EV), Hybrid Electrical Vehicle (HEV), or the like, and supplies a power to a motor, etc. Also, a plurality of storage cells connected in series are provided in the multiple cell battery. In the embodiments described hereinafter, a lithium-ion battery is used as the storage cell. However, a nickel-hydrogen battery, an electric double layered capacitor, a capacitor may be employed as other embodiments. Here, the term "discharge" mentioned in the specification means not an energy output that is used to supply an electric power to a motor from the multiple cell battery but an energy output that is used to equalize cell voltages of respective cells contained in the multiple cell battery.

First Embodiment

Figure 1:
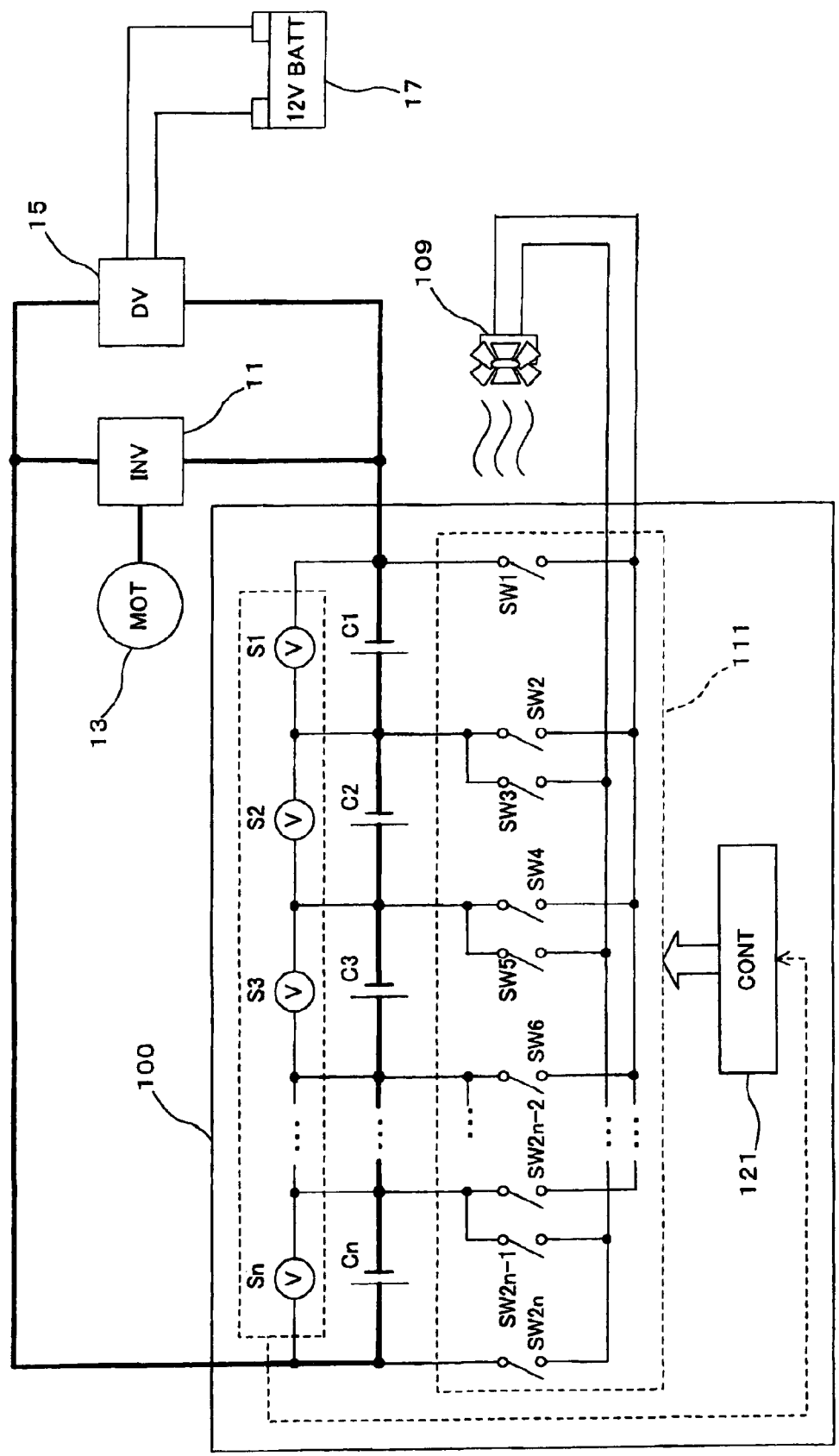
FIG. 1 is a block diagram showing a relationship between a multiple cell battery of a first embodiment installed in a vehicle, a part of an electric drive system, and accessories.

FIG. 1 is a block diagram showing a relationship between a multiple cell battery of a first embodiment installed in a vehicle, a part of an electric drive system, and accessories. The vehicle shown in FIG. 1 is equipped with a multiple cell battery 100 of the first embodiment, the inverter 11, the motor 13, the DC-DC converter 15, the battery 17, and an electric motor 109 for a cooling fan as a rotary inductive load (referred to as an "electric motor" hereinafter). The inverter 11, the motor 13, the DC-DC converter 15, and the battery 17 are the same as the constituent elements shown FIG. 23.

An output voltage of the multiple cell battery 100 of the first embodiment is a high voltage (e.g., 100 to 200 V), and an output voltage of the battery 17 is a voltage for the accessories (e.g., low voltage of 12V). The output voltage of the multiple cell battery 100 is converted from DC to AC by the inverter 11, and then is fed to the motor 13. Also, the output voltage of the multiple cell battery 10 is stepped down by the DC-DC converter 15, and then charges the battery 17. An electric power is supplied to the electric motor 109 by the discharge from the cells in the multiple cell battery 100. An airflow is generated by the cooling fan driven by the electric motor 109, and cools the multiple cell battery 100.

In this case, an operation of the electric motor 109 is ensured by a driving voltage of 9 to 14V Also, the electric motor 109 is not limited to the electric motor for the cooling fan in not only the present embodiment but also other embodiments. The electric motor for the accessories such as an electric motor for a cooling pump, an electric motor for a blower of an air cleaner, and the like may be employed. Also, a supply destination of an electric power generated by the cell discharge is not limited to the electric motor 109 as a rotary inductive load. A load driving power feeding circuit for feeding an electric power to a power-variable load may be employed. As the power-variable load, there are a heat wire utilized as a sheet heater, a lamp utilized as a backlight of the meter, a Peltier element, the accessory such as an air cleaner, or the like. In addition, an electric power fed by the cell charge may be supplied not only to the electric motor 109 but also to other accessories as well as the electric motor 109.

The multiple cell battery 100 shown in FIG. 1 includes a plurality of lithium-ion storage cells C1 to Cn (n is an integer of 2 or more) connected in series (simply referred to as "cells" hereinafter), a discharge switch unit 111 connected in parallel with the cells C1 to Cn respectively, voltage detection units S1 to Sn connected in parallel with the cells respectively, and a control unit 121 for controlling the discharge switch unit 111. In this case, the discharge switch unit 111, the voltage detection units S1 to Sn, and the control unit 121 are integrated and formed on an IC chip.

Here, a range of a single output voltage of the respective cells C1 to Cn is 2.5 to 4.0 V. In this case, a relationship between State of Charge (SOC) of the lithium-ion cell and the output voltage is substantially linear. In the multiple cell battery installed into the vehicle, the charge/discharge is repeatedly performed between a predetermined width of the remaining contents (SOC) of the cells.

The discharge switch unit 111 has switches Sw1 to SW2n connected between respective cells. In this event, the switches SW1 and SW2, SW4, ..., SW2n-2 are connected to a minus-side input terminal of the electric motor 109, and the switches SW3, SW5, ..., SW2n-1, and SW2n are connected to a plus-side input terminal of the electric motor 109.

The voltage detection units S1 to Sn detect a voltage across the cell (cell voltage) among the series-connected cells respectively. In this case, the voltage detection units S1 to Sn detect the respective cell voltages of the cells continuously or periodically, and send respective detection results to the control unit 121.

The control unit 121 decides the SOC of the respective cells, based on the detection results being sent from the voltage detection units S1 to Sn. As described above, the relationship between the SOC of the lithium-ion cell and the output voltage is substantially linear, and also a relationship between the SOC of the respective cells and the cell voltage is substantially linear. The control unit 121 controls individually ON/OFF of the switches SW1 to SW2n in the discharge switch unit 111 in response to the newest decision result about the SOC such that the SOC of the respective cells, i.e., the cell voltages of the respective cells are kept at the same level. A discharge path from at least one cell of the series-connected cells to the electric motor 109 is formed when the switches SW1 to SW2n are ON/OFF-controlled by the control unit 121. Therefore, an electric power is fed to the electric motor 109 from the cells contained in the closed circuit that is formed by the ON/OFF control of the control unit 121. For example, when the control unit 121 turns ON the switches SW1, SW3 and turns OFF other switches, an electric power is fed from the cell C1 to the electric motor 109. Also, when the control unit 121 turns ON the switches SW4, SW2n and turns OFF other switches, an electric power is fed from the cells C3 to Cn to the electric motor 109.

Figure 2:
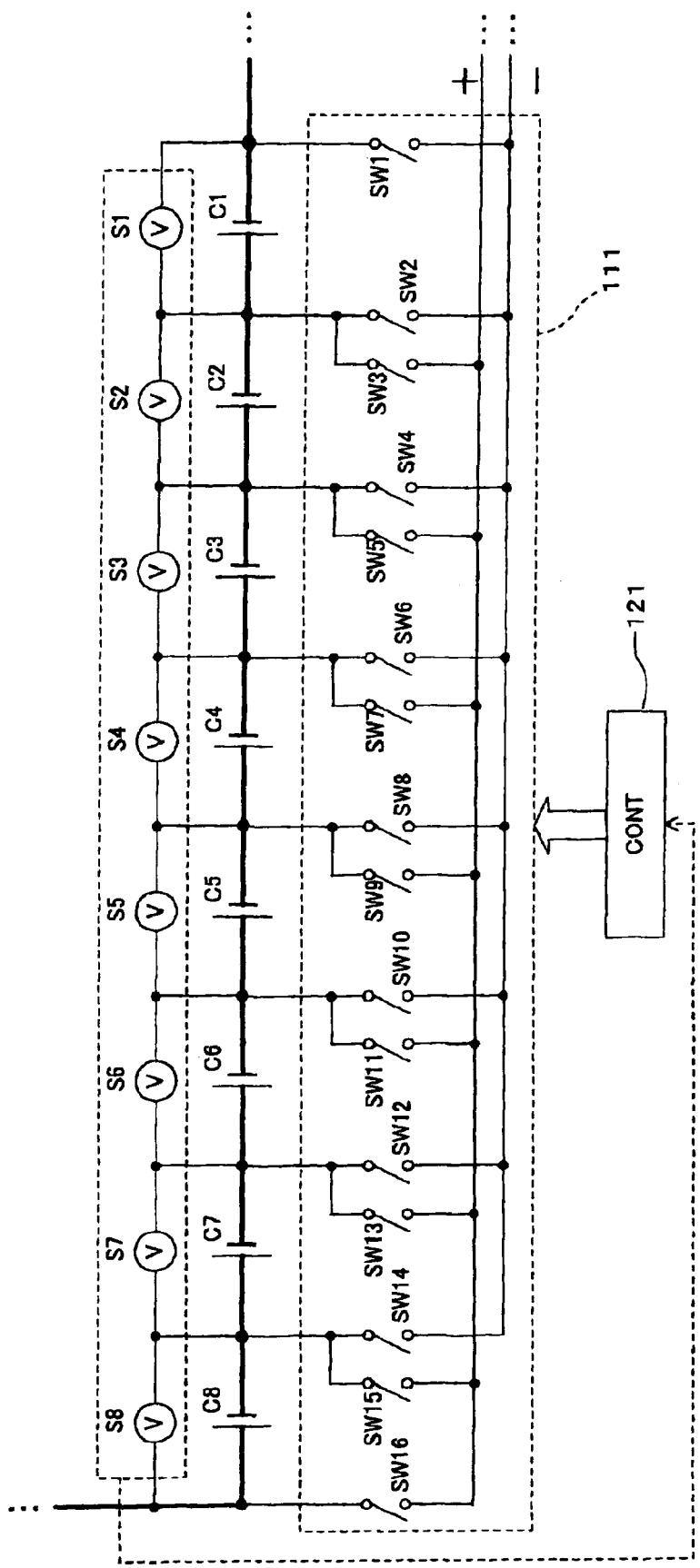
FIG. 2 is a circuit diagram showing a multiple cell battery 100 of the first embodiment having eight cells C1 to C8.
Figure 3:
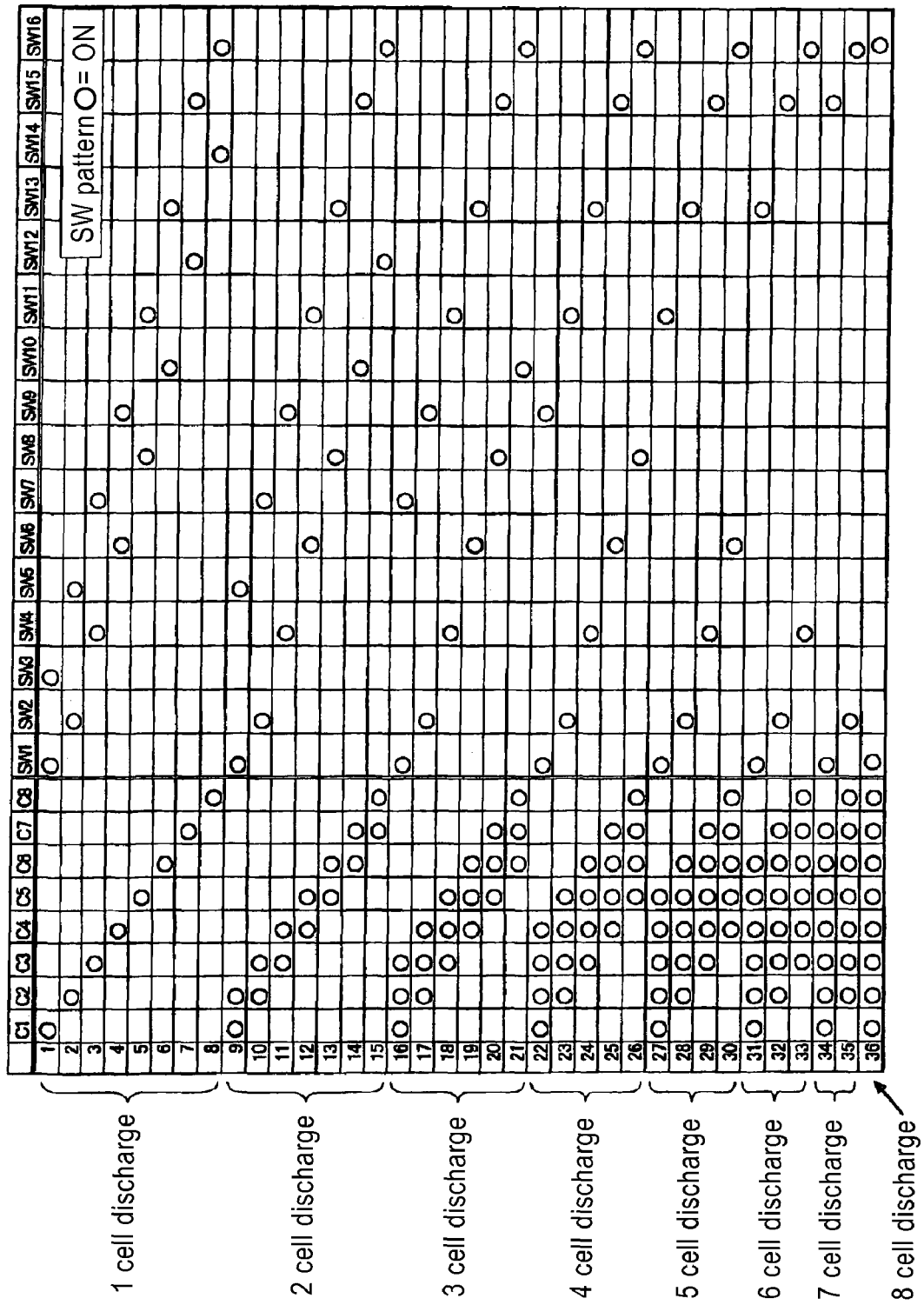
FIG. 3 is a chart showing cell discharges and ON/OFF patterns of switches in the multiple cell battery shown in FIG. 2.

FIG. 2 is a circuit diagram showing the multiple cell battery 100 of the first embodiment having eight cells C1 to C8. FIG. 3 is a chart showing cell discharges and ON/OFF patterns of the switches in the multiple cell battery shown in FIG. 2. FIG. 4 is a table showing relationships among an output voltage of a single cell, a number of discharge cells, a maximum cell voltage, and the discharge voltage. In the case of the multiple cell battery 100 shown in FIG. 2, the control unit 121 performs the ON/OFF control of the switches SW1 to SW2n explained hereinafter, in response to the decision results decided by the voltage detection units S1 to Sn.

The ON/OFF control performed by the control unit 121 of the multiple cell battery 100 of the first embodiment will be described in detail while classifying into "group setting", "another group setting", "group selecting", and "group switching" respectively.

Figure 5:
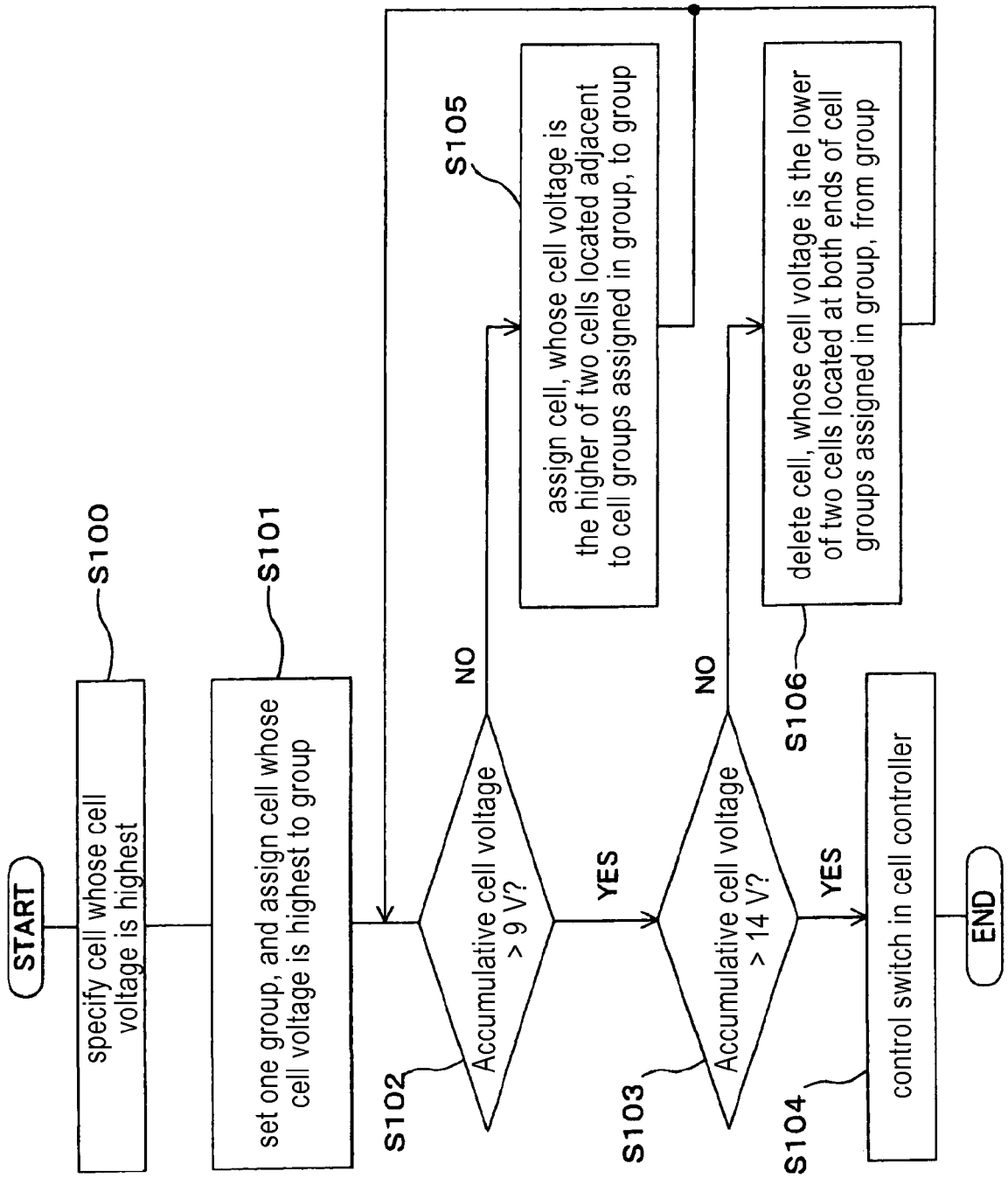
FIG. 5 is a flowchart showing a group setting executed by a control unit 121 of the multiple cell battery 100 of the first embodiment.
Figure 6:
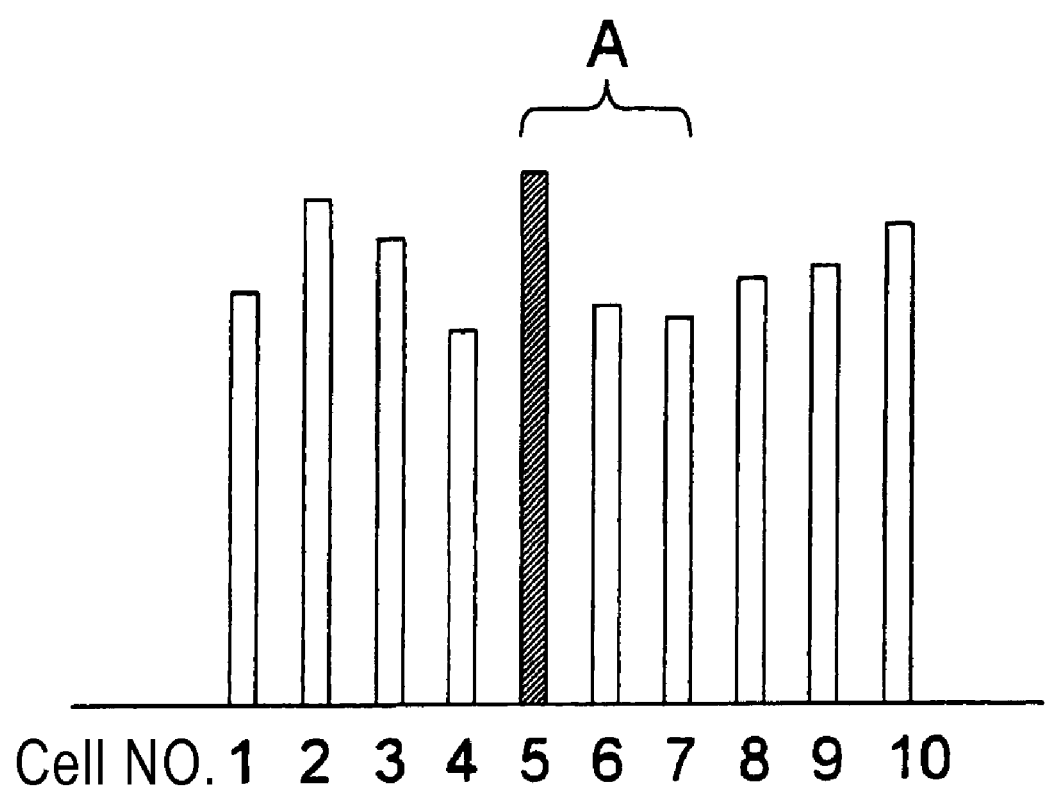
FIG. 6 is a view showing an example of cell voltages of the cells in the multiple cell battery 100 of the first embodiment.

First, the "group setting" performed by the control unit 121 of the first embodiment will be described with reference to FIG. 5 and FIG. 6 hereunder. FIG. 5 is a flowchart showing the group setting performed by the control unit 121 of the multiple cell battery 100 of the first embodiment. Also, FIG. 6 is a view showing an example of cell voltages of the respective cells in the multiple cell battery 100 of the first embodiment. In an example shown in FIG. 6, the multiple cell battery 100 has 10 cells.

As shown in FIG. 5, in step S100, the control unit 121 specifies the cell whose cell voltage is highest among the cells installed into the multiple cell battery 100, based on the cell voltages of the respective cells. That is, the control unit 121 specifies the cell whose SOC is highest. Then, in step S101, the control unit 121 assigns the cell whose cell voltage is highest to one group. Then, in step S102, the control unit 121 decides whether or not an accumulation of the cell voltages of the cells assigned to this group is larger than 9 V. If an accumulative cell voltage is larger than 9 V, a process goes to step S103. Then, the control unit 121 decides whether or not an accumulative cell voltage is below 14 V. If the accumulative cell voltage is below 14 V, a process goes to step S104. Then, the control unit 121 ON/OFF-controls the switches in the discharge switch unit 111 such that the discharge path is formed from the cell assigned to the group to the electric motor 109 (step S104).

As the result of decision in step S102, if the accumulative cell voltage is less than 9 V, a process goes to step S105. In step S105, the control unit 121 assigns the cell having the higher cell voltage of two cells located adjacent to the cells assigned in the group, to the same group. Then, a process goes back to step S102. Also, as the result of decision in step S103, if the accumulative cell voltage is more than 14 V, a process goes to step S106. In step S106, the control unit 121 deletes the cell having the lower cell voltage of two cells located at both ends of the cells assigned in the group, from the group. Then, a process goes back to step S102.

In this case, it is advantageous that, in the foregoing group setting, the number of cells in one group should be set smaller. For example, when the cell voltage shown in FIG. 4 is 3.0 V, the number of cells assigned to the group may be set to three or four. In such case, the control unit 121 assigns three cells to the group. When the number of cells assigned to the group is small, an equalizing speed of the cell voltages can be increased.

Also, the control unit 121 may select the number of cells assigned to the group in response to a variation of the cell voltage (difference between a maximum cell voltage and a minimum cell voltage). That is, the control unit 121 assigns a large number of cells to the group when a variation width is small, and assigns a small number of cells to the group when a variation width is large. For example, when the cell voltage shown in FIG. 4 is 3.0 V, the number of cells assigned to the group may be set to three or four. In such case, the control unit 121 compares a variation width of the cell voltages with a threshold value. The control unit 121 assigns four cells to the group when a variation width is below the threshold value, and assigns three cells to the group when a variation width is more than the threshold value.

Then, the case where the group setting based on a flowchart described with reference to FIG. 5 is applied to the multiple cell battery having the cell voltages shown in FIG. 6 will be described hereunder. Firstly, the control unit 121 assigns the cell 5 whose cell voltage is highest to the group, and then decides whether or not the cell voltage of the cell 5 is larger than 9 V. If the cell voltage of the cell 5 is less than 9 V, the control unit 121 assigns the cell 6, whose cell voltage is the higher of two cells 4, 6 positioned adjacent to the cell 5, to the group. Then, the control unit 121 decides whether or not the accumulative cell voltage of the cells 5, 6 is larger than 9 V. If the accumulative cell voltage of the cells 5, 6 is less than 9 V, the control unit 121 assigns the cell 7, whose cell voltage is the higher of two cells 4, 7 positioned adjacent to the cell group (cells 5, 6), to the group.

Then, the control unit 121 decides whether or not the accumulative cell voltage of the cells 5 to 7 is larger than 9 V. If the accumulative cell voltage of the cells 5 to 7 is larger than 9 V, the control unit 121 decides whether or not the accumulative cell voltage of the cells 5 to 7 is below 14 V. If the accumulative cell voltage of the cells 5 to 7 is below 14 V, the control unit 121 sets the cells 5 to 7 in one group. The control unit 121 controls ON/OFF of the switches of the discharge switch unit 111 such that the discharge paths from the cells 6, 7 to the electric motor 109 are formed.

Assume that the accumulative cell voltage of the cells 4 to 7 is more than 14 V in a state that the cells 4 to 7 are set as one group, the control unit 121 deletes the cell 4, whose cell voltage is the lower of two cells 4, 7 positioned at both ends of the cells 4 to 7 assigned in one group, from the group.

Figure 7:
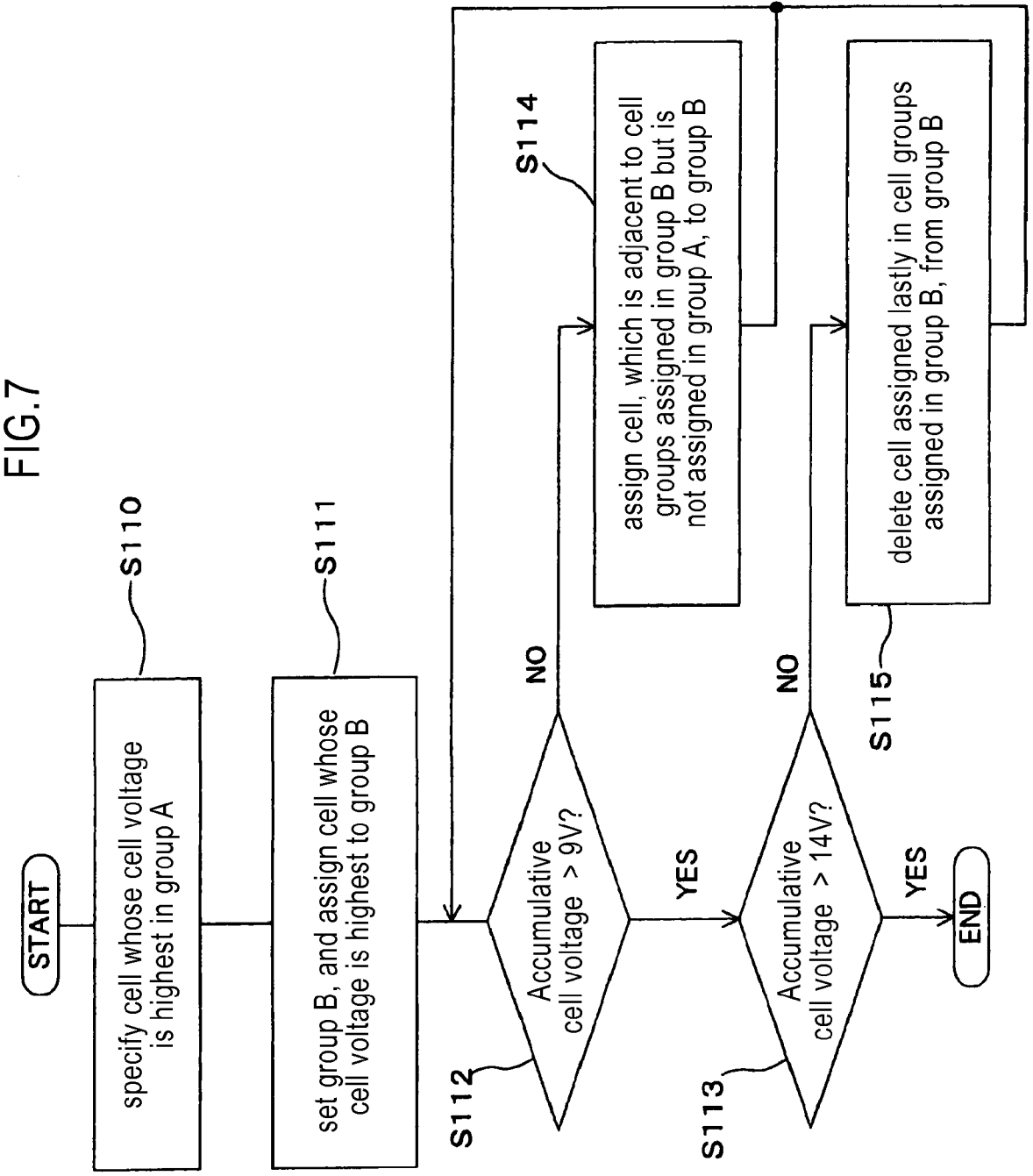
FIG. 7 is a flowchart showing another group setting executed by the control unit 121 of the multiple cell battery 100 of the first embodiment.
Figure 8:
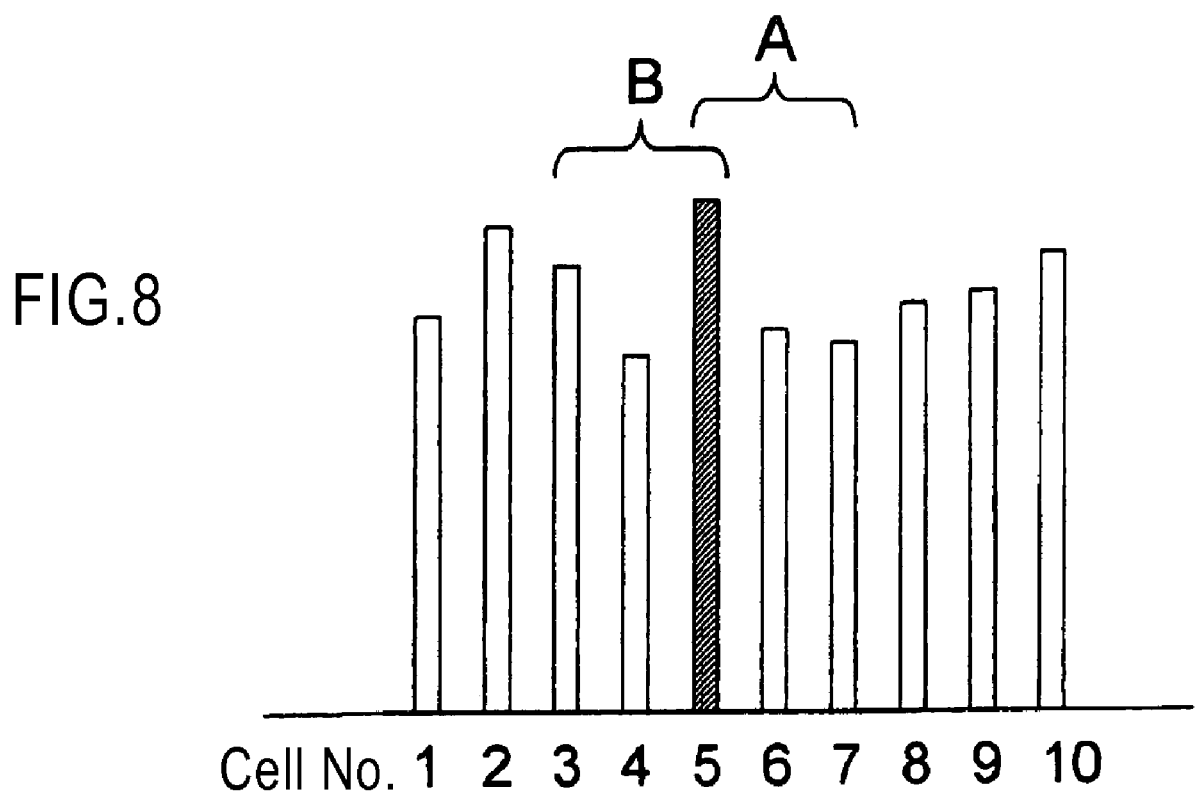
FIG. 8 is a view showing an example of cell voltages of the cells in the multiple cell battery 100 of the first embodiment.

Next, the "another group setting" performed by the control unit 121 in the first embodiment will be described with reference to FIG. 7 and FIG. 8 hereunder. FIG. 7 is a flowchart showing another group setting performed by the control unit 121 of the multiple cell battery 100 of the first embodiment. Also, FIG. 8 is a view showing an example of cell voltages of the respective cells in the multiple cell battery 100 according to the first embodiment. In an example shown in FIG. 8, the multiple cell battery 100 has 10 cells. Here, description will be started from a state that the cells 5 to 7 in the multiple cell battery 100 shown in FIG. 8 are set as the group A according to the group setting that is described with reference to FIG. 5.

As shown in FIG. 7, in step S110, the control unit 121 specifies the cell (cell 5) whose cell voltage, i.e., SOC, is highest in the group A. Then, in step S111, the control unit 121 sets the group B apart from the group A, and assigns the cell whose cell voltage is highest to the group B. Then, in step S112, the control unit 121 decides whether or not accumulative cell voltage of the cells assigned in the group B is larger than 9 V. If the accumulative cell voltage is larger than 9 V, a process goes to step S113. Then, the control unit 121 decides whether or not the accumulative cell voltage is below 14 V. If the accumulative cell voltage is below 14 V, the setting of the group B is ended.

As the result of decision in step S112, if the accumulative cell voltage of the group B is less than 9 V, a process goes to step S114. In step S114, the control unit 121 assigns the cell, which is adjacent to the cells assigned in the group B but is not assigned in the group A, to the group B. Then, a process goes back to step S112. Also, as the result of decision in step S113, if the accumulative cell voltage of the group B is more than 14 V, a process goes to step S115. In step S115, the control unit 121 deletes the cell assigned lastly in the cells assigned in the group B, from the group B. Then, a process goes back to step S112.

Next, the case where another group setting based on a flowchart described with reference to FIG. 7 is applied to the multiple cell battery having the cell voltages shown in FIG. 8 will be described hereunder. The control unit 121 specifies the cell 5 whose cell voltage is highest in the group A, and assigns this cell 5 to the group B. Then, the control unit 121 decides whether or not the cell voltage of the cell 5 is larger than 9 V. If the cell voltage of the cell 5 is less than 9 V, the control unit 121 assigns the cell 4, which is adjacent to the cell 5 but is not assigned in the group A, to the group B. Then, the control unit 121 decides whether or not the accumulative cell voltages of the cells 5, 4 are larger than 9 V. If the accumulative cell voltage of the cells 5, 4 is less than 9 V, the control unit 121 assigns the cell 3, which is adjacent to the cell group (cells 5, 4) in the group B but is not assigned in the group A, to the group B.

Then, the control unit 121 decides whether or not an accumulative cell voltage of the cells 5, 4, 3 is larger than 9 V. If the accumulative cell voltage of the cells 5, 4, 3 is larger than 9 V, the control unit 121 decides whether or not the accumulative cell voltage of the cells 5, 4, 3 is below 14 V. If the accumulative cell voltage of the cells 5, 4, 3 is below 14 V, the control unit 121 sets the cells 5, 4, 3 in the group B apart from the group A. If the accumulative cell voltage of the cells 5, 4, 3 is more than 14 V, the control unit 121 deletes the cell 3, which is assigned lastly in the cells 5, 4, 3 assigned in the group B, from the group B.

Next, the "group choosing" performed by the control unit 121 of the first embodiment will be described with reference to FIG. 8 hereunder. The control unit 121 specifies the cells having the smallest cell voltage in the groups A, B, which are set by the flowcharts shown in FIG. 5 and FIG. 7, respectively. In an example shown in FIG. 8, the cell whose cell voltage is smallest in the group A is the cell 7, and the cell whose cell voltage is smallest in the group B is the cell 4. The control unit 121 does not select the group to which the cell whose cell voltage is smallest among the cells in the multiple cell battery 100 is assigned. In an example shown in FIG. 8, because the cell whose cell voltage is smallest among the cells in the multiple cell battery 100 is the cell 4, the control unit 121 does not select the group B and selects the group A.

Figure 9:
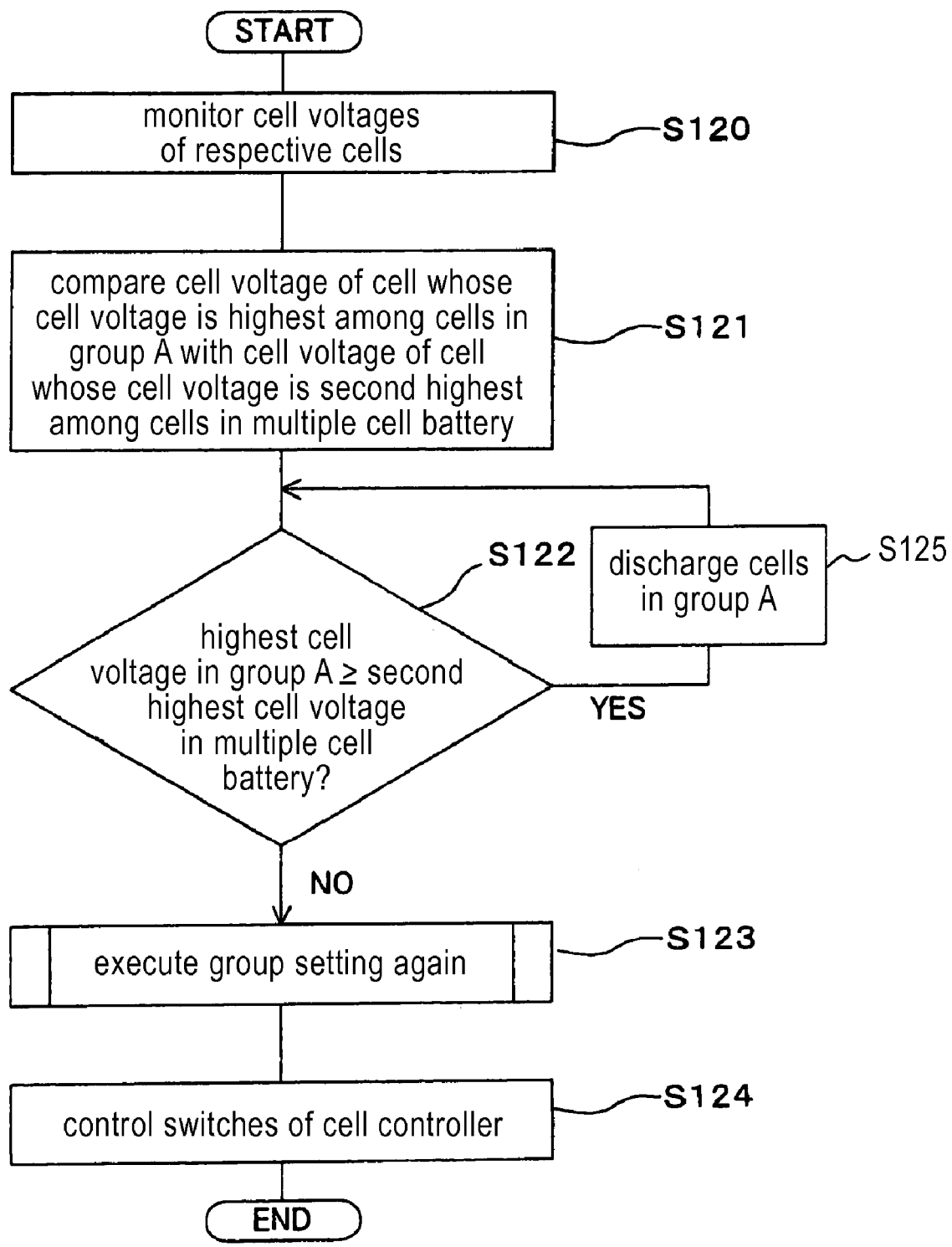
FIG. 9 is a flowchart showing a first group switching executed by the control unit 121 of the multiple cell battery 100 of the first embodiment.

Next, the "first group switching" performed by the control unit 121 in the first embodiment will be described with reference to FIG. 9 and FIG. 10 hereunder. FIG. 9 is a flowchart showing the first group switching performed by the control unit 121 of the multiple cell battery 100 of the first embodiment. Also, FIGS. 10A to 10C are views showing an example of cell voltages of the respective cells in the multiple cell battery 100 of the first embodiment. In an example shown in FIGS. 10A to 10C, the multiple cell battery 100 has 10 cells. Here, description will be started from a state that the discharge paths are formed from the cells 4 to 7 (group A) in the multiple cell battery 100 shown in FIG. 10 to the electric motor 109.

As shown in FIG. 9, in step S120, the control unit 121 monitors the cell voltages of the respective cells obtained from the voltage detection units S1 to S10. The cell voltages of the respective cells drop down along with the discharge from the cells 4 to 7, while keeping their magnitude relationship. In step S121, the control unit 121 compares the cell voltage of the cell 5 whose cell voltage is highest among the cells 4 to 7 assigned in the group A with the cell voltage of the cell 2 whose cell voltage is second highest among the cells contained in the multiple cell battery 100. Then, in step S122, the control unit 121 decides whether or not the cell voltage of the cell 5 is equal to or more than that of the cell 2. Then, the control unit 121 performs again the group setting described with reference to FIG. 5 (step S123) at a point of time when the cell voltage of the cell 5 becomes lower than the cell voltage of the cell 2 due to the discharge from the cells 4 to 7 assigned in the group A (step S125). As a result, a group C shown in FIG. 10 is set. Then, in step S124, the control unit 121 controls ON/OFF of the switches in the discharge switch unit 111 such that the path from the cell assigned in the group A to the electric motor 109 is opened and the path from the cell assigned in the group C to the electric motor 109 is closed.

In this case, in above step S122, the control unit 121 decides whether or not the cell voltage of the cell 5 is equal to or more than the cell voltage of the cell 2, and then switches the group to another group at a point of time when the cell voltage of the cell 5 becomes lower than the cell voltage of the cell 2. Also, a hysteresis may be provided to the group switching. More particularly, the control unit 121 does not switch the group to another group immediately after the cell voltage of the cell 5 becomes smaller than the cell voltage of the cell 2, but switches the group to another group at a point of time when the cell voltage of the cell 5 becomes lower than a value obtained by subtracting an overshoot value from the cell voltage of the cell 2. As a result, the number of times of the group switching is reduced and thus the control is made smooth when the overshoot value is large, while the equalization of the remaining electricity storages can be performed by the fine group switching when the overshoot value is small.

In the above first group switching explained above, the control unit 121 compares the highest cell voltage among the cells assigned in the group with the second highest cell voltage among the cells contained in the multiple cell battery 100. But the lowest cell voltage among the cells assigned in the group and the second lowest cell voltage among the cells contained in the battery assembly 100 may be compared with each other, and then the control unit 121 may switch the group in response to the compared result as a second group switching.

Figure 11:
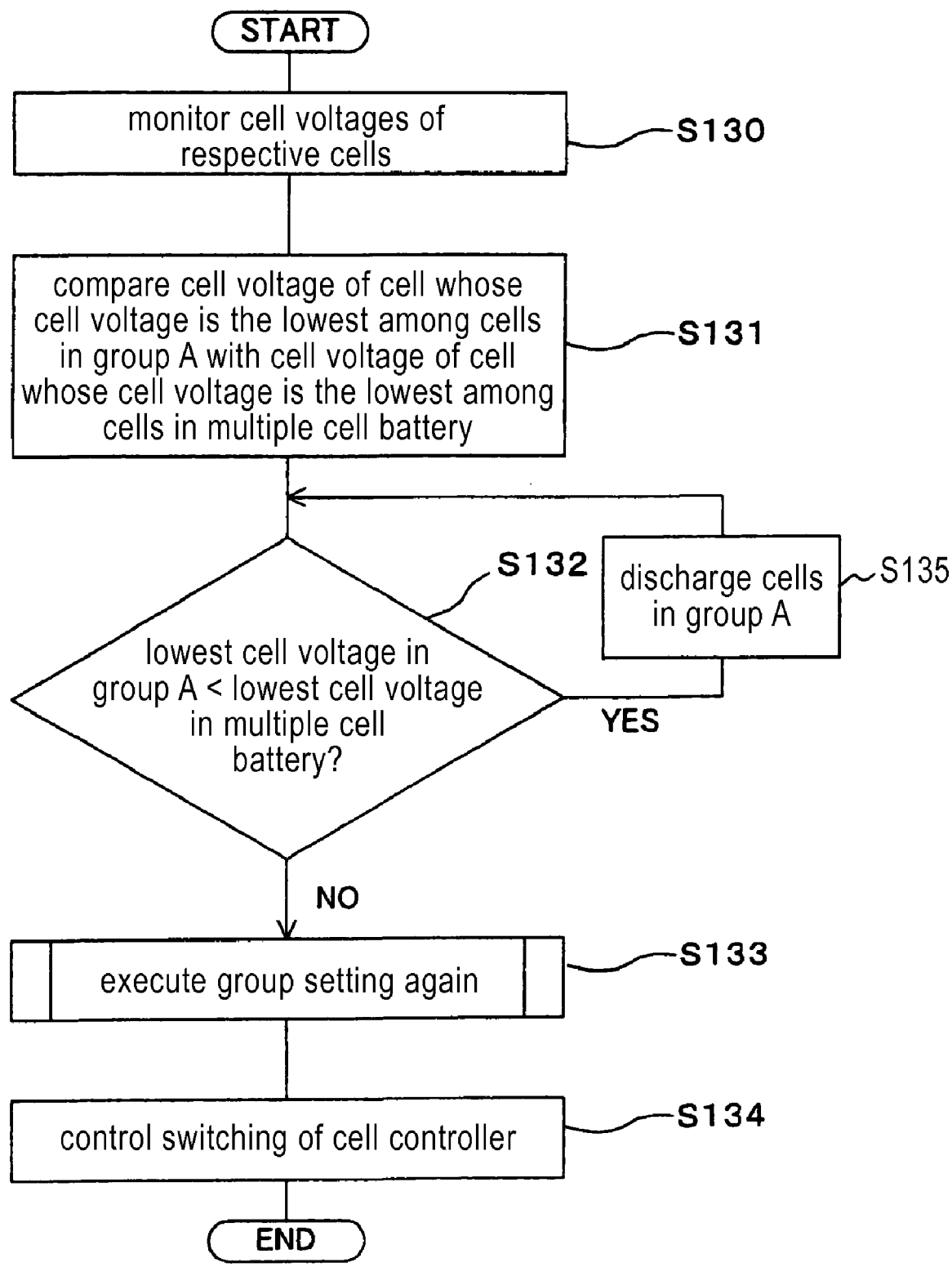
FIG. 11 is a flowchart showing a second group switching executed by the control unit 121 of the multiple cell battery 100 of the first embodiment.
Figure 12A:
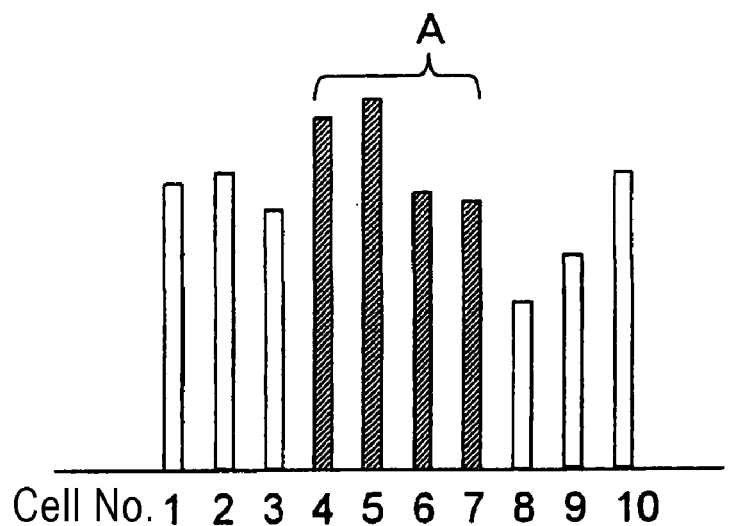
FIGS. 12A to 12C are views showing an example of cell voltages of the cells in the multiple cell battery 100 of the first embodiment.
Figure 12B:
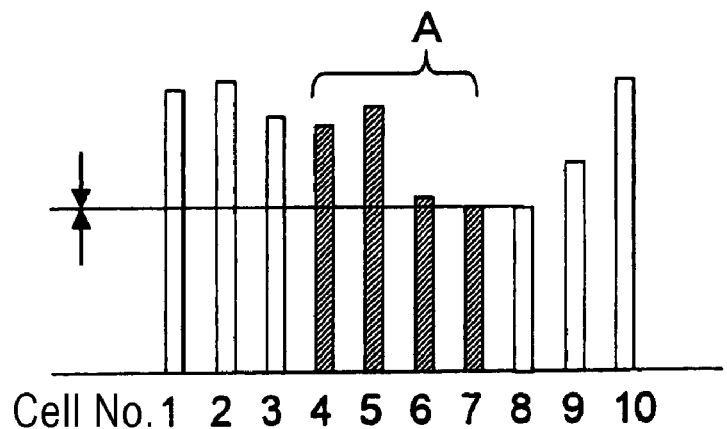
Figure 12C:
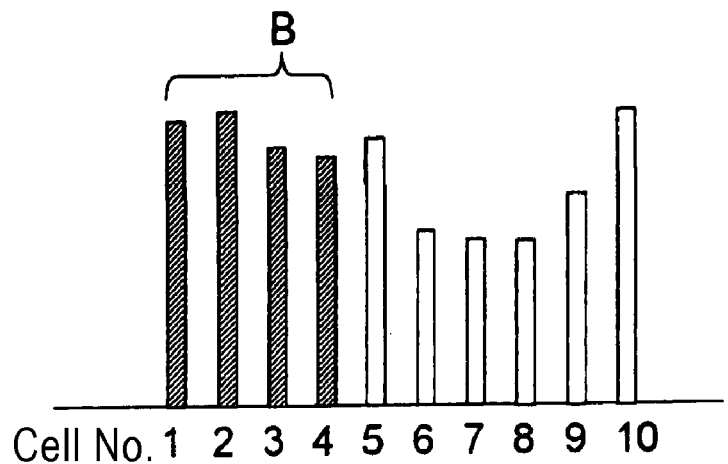

Next, the "second group switching" performed by the control unit 121 in the first embodiment will be described with reference to FIG. 11 and FIGS. 12A to 12C hereunder. FIG. 11 is a flowchart showing the second group switching performed by the control unit 121 of the multiple cell battery 100 of the first embodiment. Also, FIGS. 12A to 12C are views showing an example of cell voltages of the respective cells in the multiple cell battery 100 of the first embodiment. In an example shown in FIGS. 12A to 12C, the multiple cell battery 100 has 10 cells. Here, description will be started from a state that the discharge paths are formed from the cells 4 to 7 (group A) in the multiple cell battery 100 shown in FIG. 12 to the electric motor 109.

As shown in FIG. 11, in step S130, the control unit 121 monitors the cell voltages of the respective cells obtained from the voltage detection units S1 to S10. The cell voltages of the respective cells drop down along with the discharge from the cells 4 to 7, while keeping their magnitude relationship. In step S131, the control unit 121 compares the cell voltage of the cell 7 whose cell voltage is lowest among cells 4 to 7 assigned in the group A with the cell voltage of the cell 8 whose cell voltage is lowest among cells in the multiple cell battery 100. Then, in step S132, the control unit 121 decides whether or not the cell voltage of the cell 7 is less than that of the cell 8. Then, the control unit 121 performs again the group setting described with reference to FIG. 5 (step S133) at a point of time when the cell voltage of the cell 7 becomes equal to the cell voltage of the cell 8 due to the discharge from the cells 4 to 7 assigned in the group A (step S135). As a result, a group B shown in FIG. 12 is set. Then, in step S134, the control unit 121 controls ON/OFF of the switches in the discharge switch unit 111 such that the path from the cell assigned in the group A to the electric motor 109 is opened and the path from the cell assigned in the group B to the electric motor 109 is closed.

When the second group switching is performed, such an event can be prevented that the cell whose cell voltage is lower than the lowest cell voltage among the cells contained in the multiple cell battery 100 is produced.

The ON/OFF control of the control unit 121 described above may be equipped with a function described later.

<Increase/Decrease of the Number of Cells in Response to the Power Request for the Load>

In the present embodiment, an example in which the electric motor 109 for the cooling fan is employed as the rotary inductive load that consumes an electric power discharged from the multiple cell battery 100 is described. As described above, the accessory is not limited to the electric motor 109. Also, the accessory such as an electric motor for a cooling pump, an electric motor for a blower of an air cleaner, a load driving power feeding circuit for feeding an electric power to a power-variable load such as a heat wire, a lamp, or the like may be employed. In this case, since the necessary electric power is different depending on the accessory, the control unit 121 can change a threshold value used in steps S102, S103 in the flowchart shown in FIG. 5 and a threshold value used in steps S112, S113 in the flowchart shown in FIG. 7, in response to the necessary electric power.

For example, since the electric motor 109 needs a drive voltage of 8 to 14 V, the accumulative cell voltage of the group is set in a range of 8 to 14 V. Upon driving the accessory that needs a drive voltage of 11 to 17 V, the control unit 121 selects the cells assigned in the group such that the accumulative cell voltage is set in a range of 11 to 17 V. Also, the control unit 121 may change a threshold value in response to the volume of air generated by the cooling fan that is driven by the electric motor 109.

Figure 13:
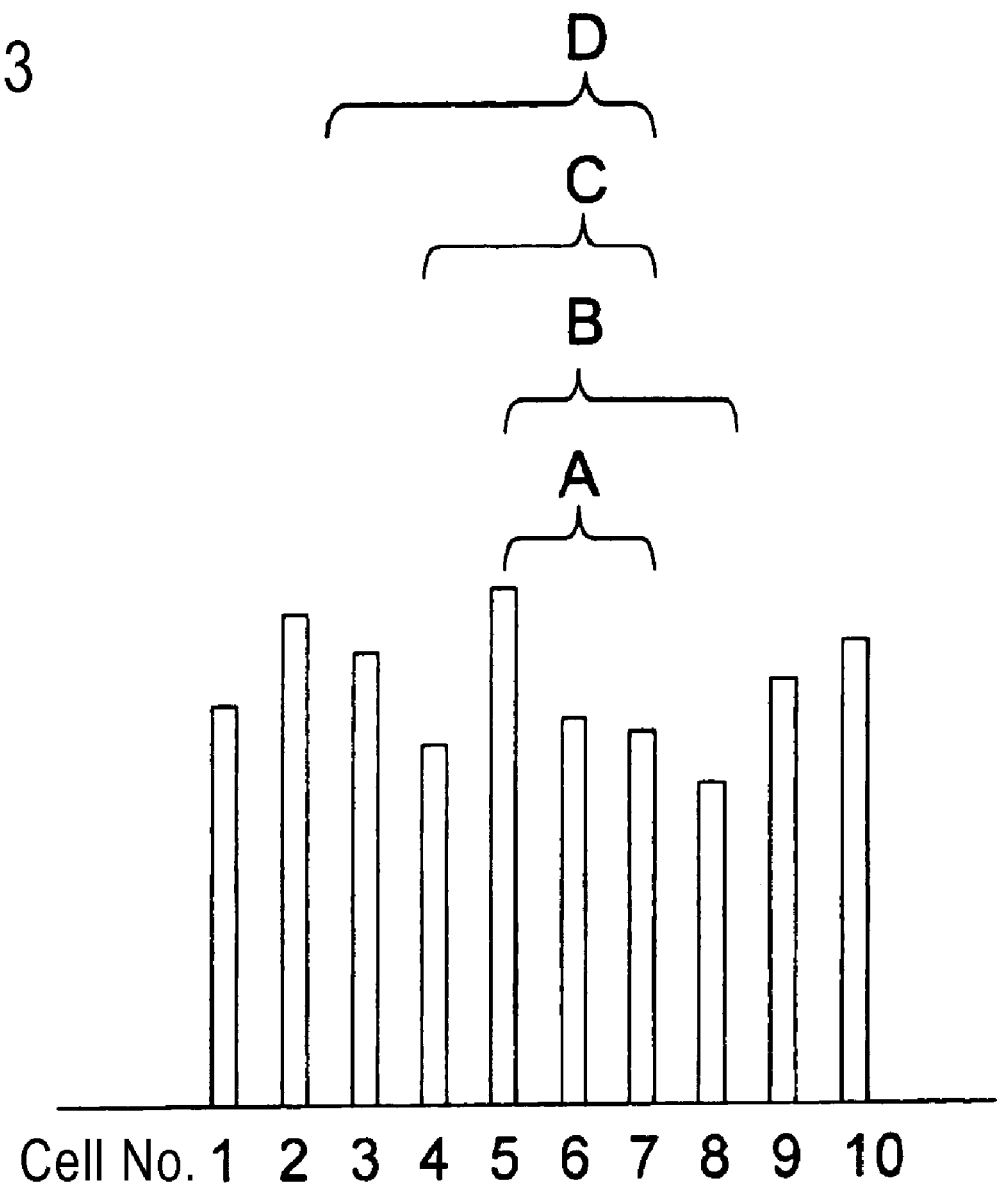
FIG. 13 is a view showing an example of cell voltages of the cells in the multiple cell battery 100 with groups A to D.

FIG. 13 is a view showing an example of the cell voltages of the respective cells in the multiple cell battery 100 and groups A to D. The control unit 121 selects one group from the groups A, C and D in response to the electric power necessary for the load. Since the cell whose cell voltage is smallest is assigned in the group B, this group B is eliminated from the subject of the group selection.

<Addition of the Cell to Compensate for a Reduction in the Cell Voltage>

The cell voltage of the cell in which the discharge is performed drops down. Since a supply power to the load is reduced along with a drop of the cell voltage, such a situation is caused that an electric power required for the load cannot be supplied. Therefore, when the cell voltage drops down, the cell is added to the discharging group and an electric power is fed from this cell, so that an electric power supplied to the load is ensured. The added cell corresponds to the cell whose cell voltage is the higher of two cells that are adjacent to the cells assigned in the group.

Figure 14A:
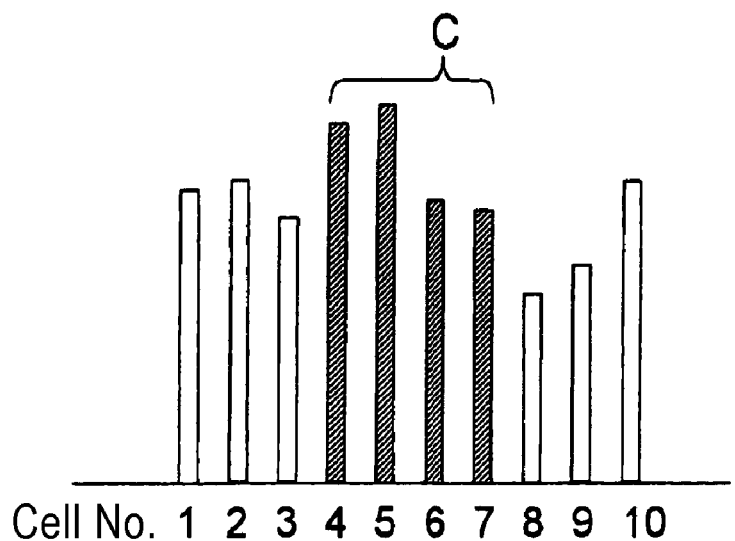
FIGS. 14A to 14C are views showing an example of cell voltages of the cells in the multiple cell battery 100.
Figure 14B:
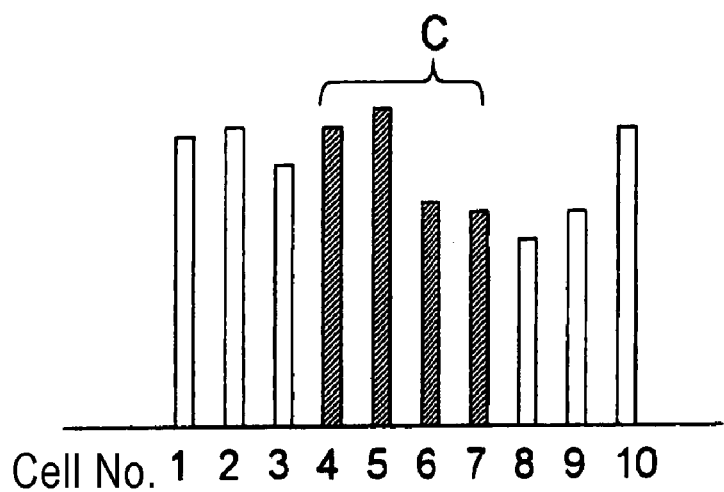
Figure 14C:
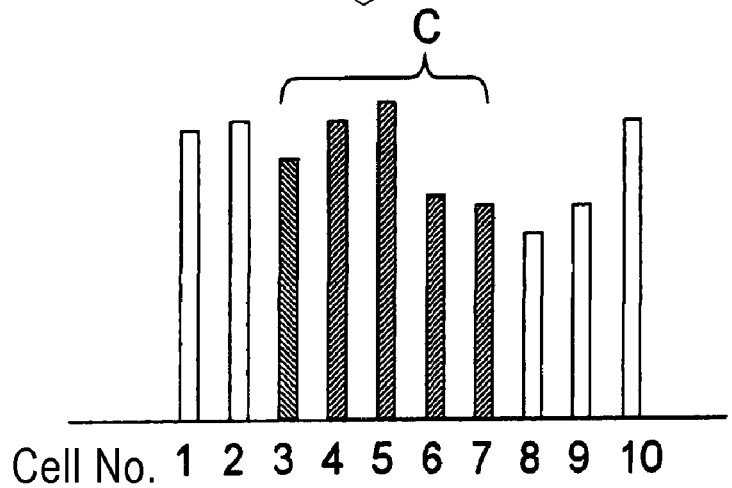

FIGS. 14A to 14C are views showing an example of the cell voltages of the respective cells contained in the multiple cell battery 100. As shown in FIG. 14, an electric power discharged from the cells 4 to 7 assigned to the group C is supplied to the load that needs a drive voltage of 10 to 15 V, for example. When the cell voltage is lowered by the discharge and the accumulative cell voltage is reduced to 11.3 V from a state that the accumulative cell voltage of the cells 4 to 7 shown in FIG. 14A is 13.7 V, the control unit 121 adds the cell 3, whose cell voltage is the higher of two cells 3, 8 located adjacent to the cells 4 to 7, to the group C. The accumulative cell voltage of the cells 3 to 7 is 14.1 V when the cell voltage of the cell 3 is 2.8 V. As a result, such a condition can be still maintained that an enough electric power can be supplied to the load.

As described above, according to the multiple cell battery 100 of the present embodiment, an electric power that is discharged from the cell by the ON/OFF-control of the switches in the discharge switch unit 111 of the control unit 121 is utilized to drive the electric motor 109. In this manner, an electric power that is converted into a heat by the resistor in the related art is utilized effectively. Also, in the related art, an electric power for the electric motor 109 is supplied from the battery 17. In contrast, in the present embodiment, an electric power discharged from the cell is supplied to the electric motor 109. Therefore, a power consumption of the battery 17 can be reduced. As described above, the battery 17 is charged by the voltage that is fed from the multiple cell battery 100 and stepped down by the DC-DC converter 15, and thus a power loss is caused in the DC-DC converter 15. For this reason, a reduction in the power consumption of the multiple cell battery 100 can be implemented indirectly by reducing the power consumption of the battery 17.

Also, when comparing a rate at which the discharge power from the cell is converted into a heat by the resistor with a rate at which the electric power is consumed in the electric motor 109, a rate at which the electric power is consumed in the electric motor 109 is overwhelmingly rapid. Accordingly, a discharge time can be shortened rather than the related art. Also, when comparing a quantity of heat generated when the discharge power from the cell is converted into a heat by the resistor with a quantity of heat generated when an electric power is consumed in the electric motor 109, a quantity of heat generated when an electric power is consumed in the electric motor 109 is overwhelmingly small. As a result, there is no need to apply the high-level heat measures that is needed in the related art, and also the influence on the integrated circuit constructed by the discharge switch unit 111, the voltage detection units S1 to Sn, and the control unit 121 becomes small.

Figure 23:
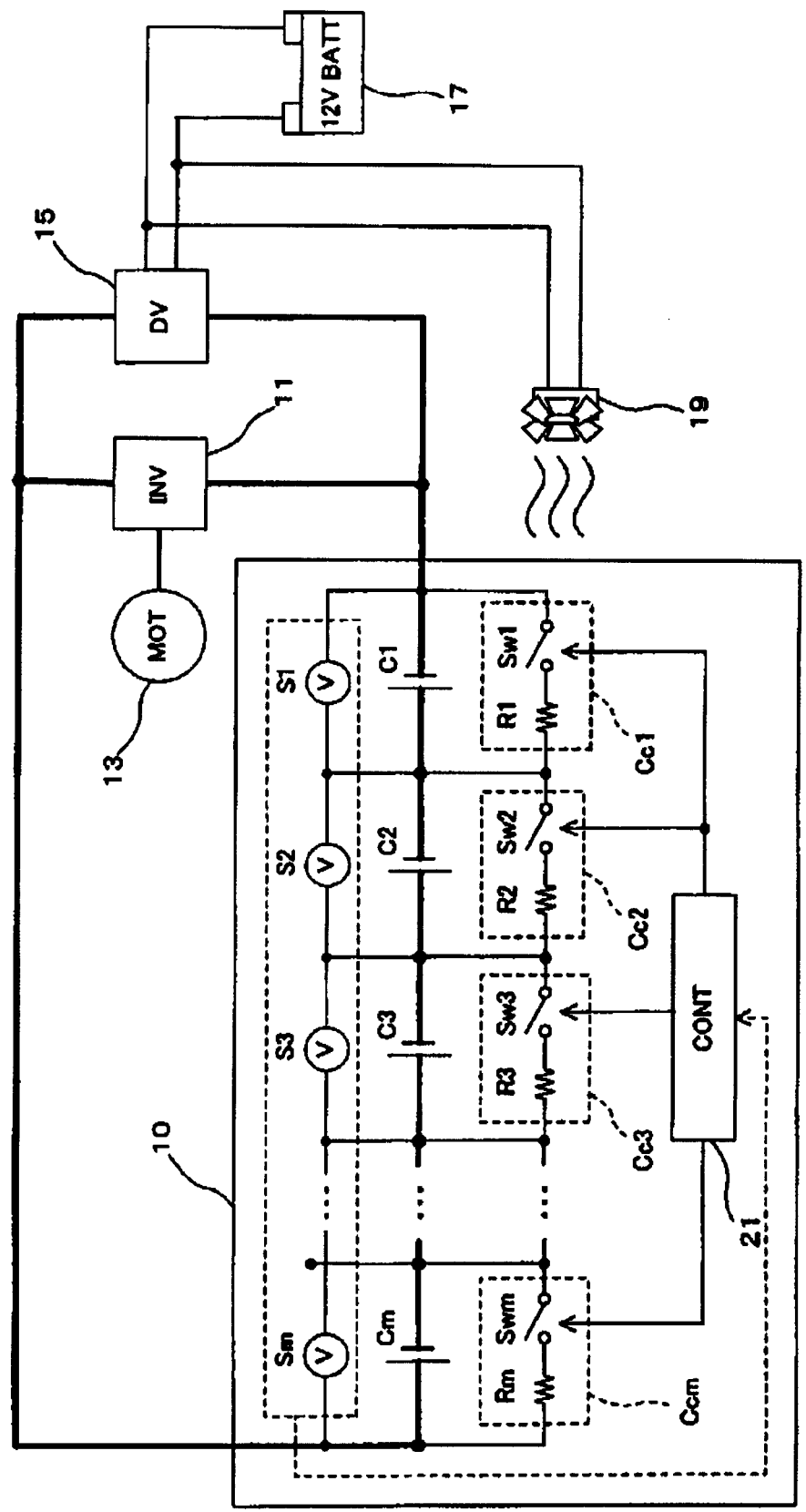
FIG. 23 is a block diagram showing a relationship between a multiple cell battery installed in a vehicle, a part of an electric drive system, and accessories in the related art.
Figure 24:
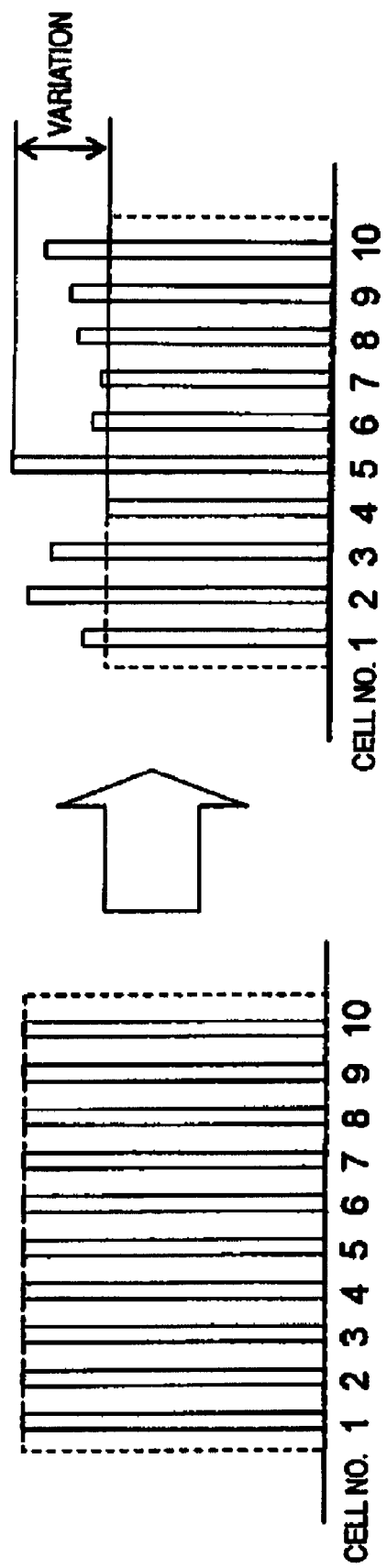
FIG. 24 is a view showing a variation in cell voltages of the cells in the multiple cell battery 10 shown in FIG. 23 and a reduction in electricity storage of the multiple cell battery 10.
Figure 25:
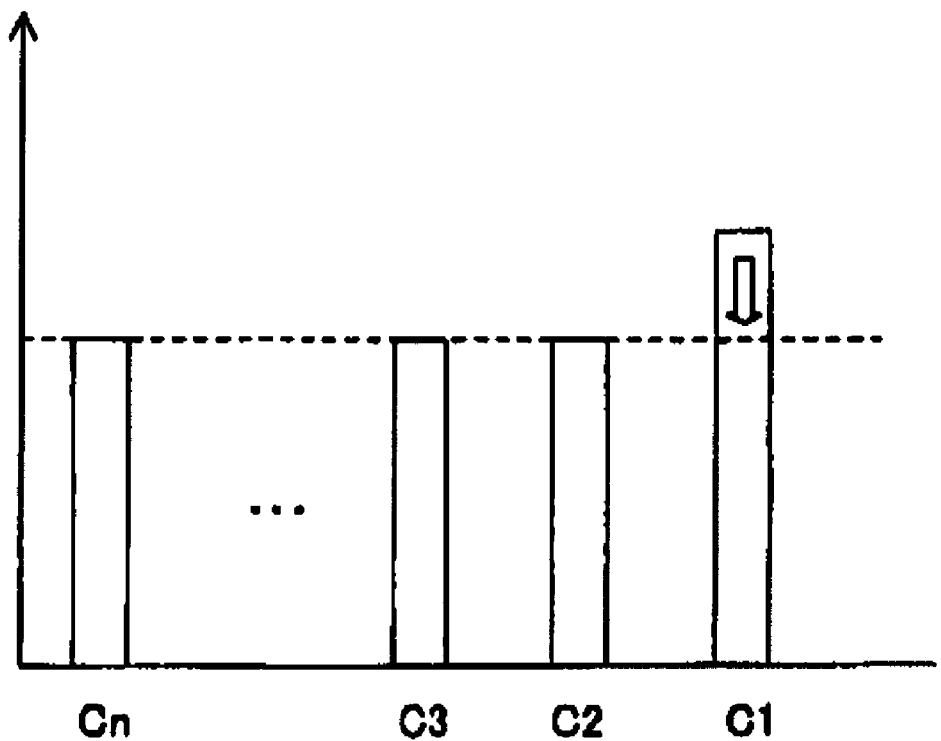
FIG. 25 is a view showing an example of cell voltages of the cells in the multiple cell battery 10 shown in FIG. 23.

In this case, when comparing the multiple cell battery 10 shown in FIG. 23 with the multiple cell battery 100 of the present embodiment, the number of the switches is large in the present embodiment. However, since the discharge switch unit 111 is implemented by the integrated circuit and no resistor is provided in the multiple cell battery 100 of the present embodiment, an increase of the number of switches seldom exerts an influence upon a cost of the multiple cell battery. On the contrary, a lower cost can be realized because no resistor is provided.

Second Embodiment

In the first embodiment, the discharge path is formed from at least one cell of the series-connected cells to the electric motor 109 for the cooling fan as the rotary inductive load, by the ON/OFF-control of the switches SW1 to SW2n of the control unit 121. In a second embodiment, the discharge path is formed from one cell whose cell voltage is highest among the cells installed into the multiple cell battery 100 to the electric motor 109. A relationship between the multiple cell battery, a part of the electric drive system, and the accessories in the second embodiment is substantially similar to that shown in FIG. 1 in the first embodiment. But the control unit provided to the multiple cell battery in the second embodiment performs the ON/OFF-control of the switches SW1 to SW2n, which is different from the control unit 121 in the first embodiment.

Figure 15:
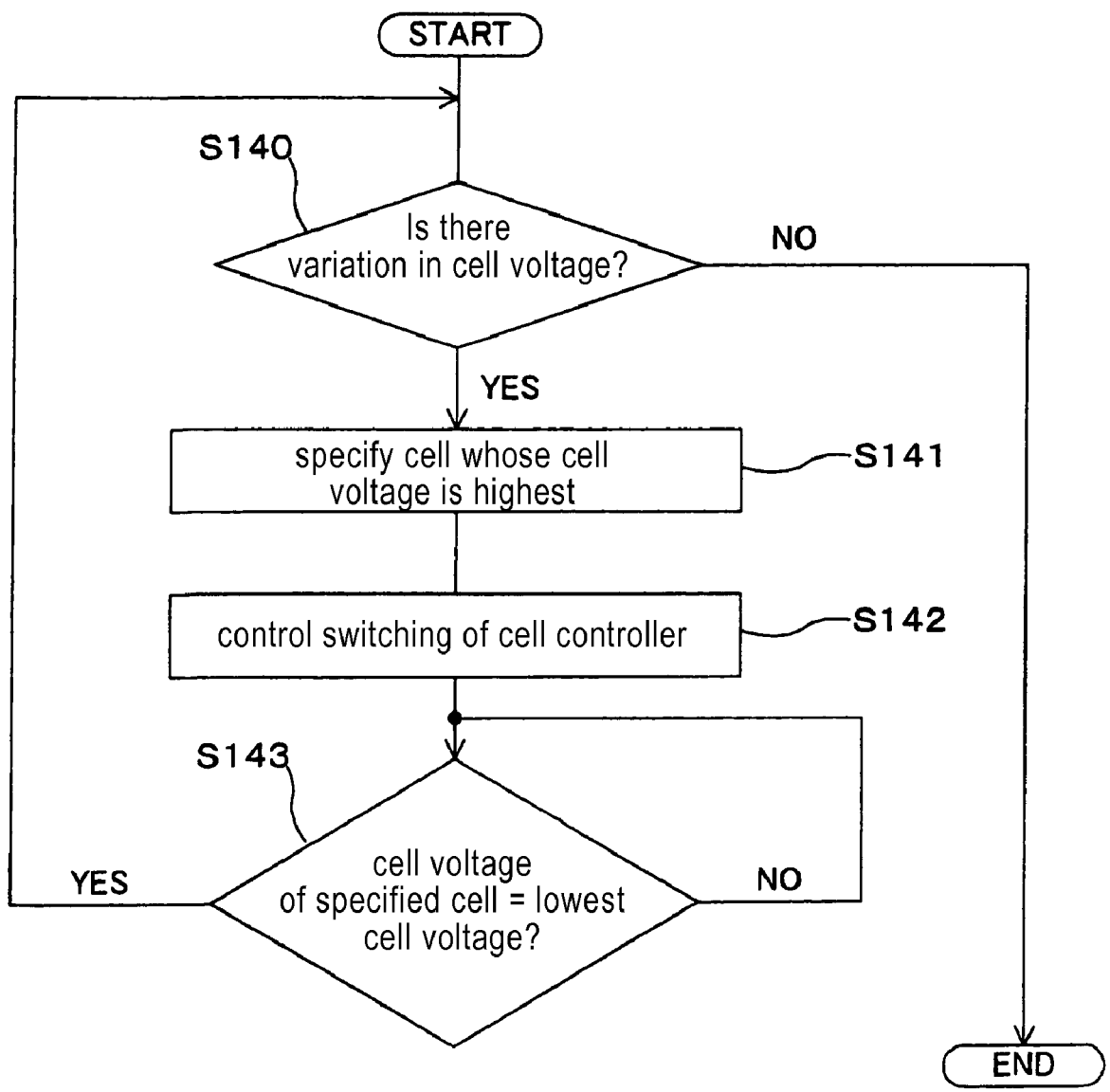
FIG. 15 is a flowchart showing discharge control executed by a control unit of a multiple cell battery of a second embodiment.

The discharge control performed by the control unit in the second embodiment will be described with FIG. 15 and FIGS. 16A to 16F hereunder. FIG. 15 is a flowchart showing discharge control performed by the control unit of a multiple cell battery in the second embodiment. FIGS. 16A to 16F are views showing an example of cell voltages of the respective cells in the multiple cell battery of the second embodiment. In an example shown in FIGS. 16A to 16F, the multiple cell battery has 10 cells.

As shown in FIG. 15, in step S140, the control unit decides whether or not there is variation in the cell voltages of the cells installed in the multiple cell battery 100, based on the cell voltages of the respective cells obtained from the voltage detection units S1 to Sn. If there is variation in the cell voltages, a process goes to step S141. The control unit specifies the cell whose cell voltage, i.e., SOC, is highest among the cells installed into the multiple cell battery. Then, in step S142, the control unit controls ON/OFF of the switches in the discharge switch unit 111 such that the discharge path is formed from the cell whose cell voltage is highest as specified in step S141 to the electric motor 109.

When the discharge path is formed, an electric power is discharged from the cell specified in step S141 to the electric motor 109 and thus the cell voltage of the cell drops down. Then, in step S143, the control unit decides whether or not the cell voltage of the cell specified in step S141 is equal to the cell voltage of the cell whose cell voltage is lowest among the cells installed into the multiple cell battery 100. If the cell voltage of the cell specified in step S141 is equal to or less than the minimum cell voltage, a process goes back to step S140.

Figure 16A:
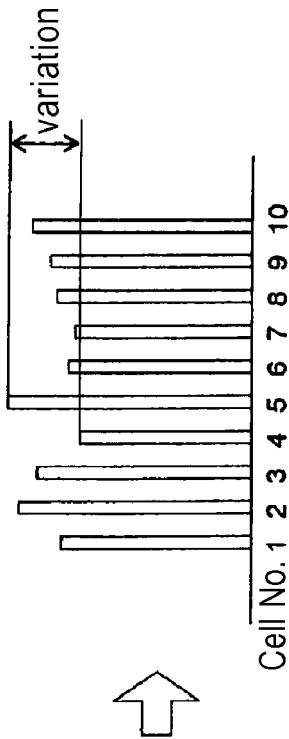
FIGS. 16A to 16F are views showing an example of cell voltages of the cells in the multiple cell battery of the second embodiment.
Figure 16B:
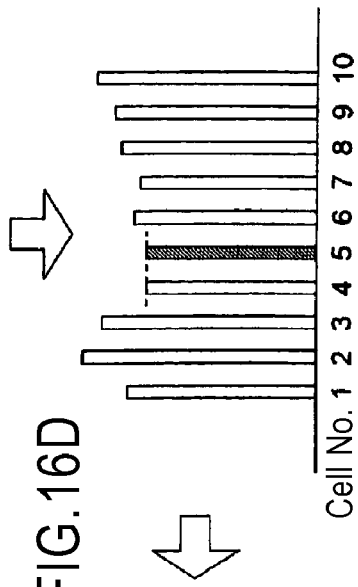
Figure 16F:
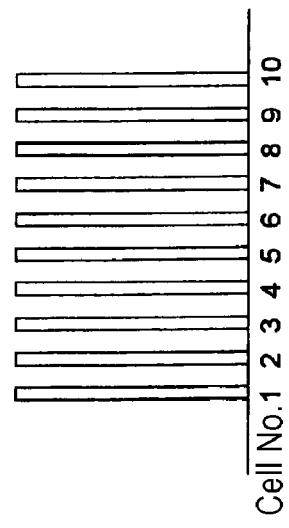
Figure 16C:
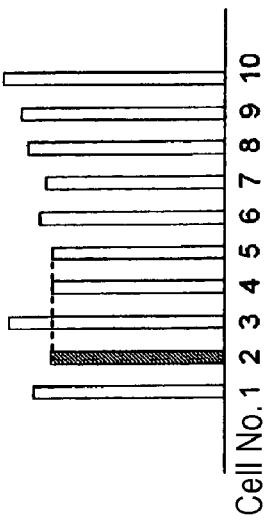

Next, the case where the discharge control based on the flowchart described with reference to FIG. 15 is applied to the multiple cell battery having the cell voltages shown in FIGS. 16A to 16F will be described hereunder. Firstly, when the cell voltages of the cells installed into the multiple cell battery is changed from a state that there is no variation shown in FIG. 16A to a state that there is variation shown in FIG. 16B, the control unit controls ON/OFF of the switches in the discharge switch unit 111 such that the discharge path is formed from the cell 5 whose cell voltage is highest to the electric motor 109. When the discharge path is formed from the cell 5 to the electric motor 109, the cell voltage of the cell 5 drops down as shown in FIG. 16C.

Figure 16E:
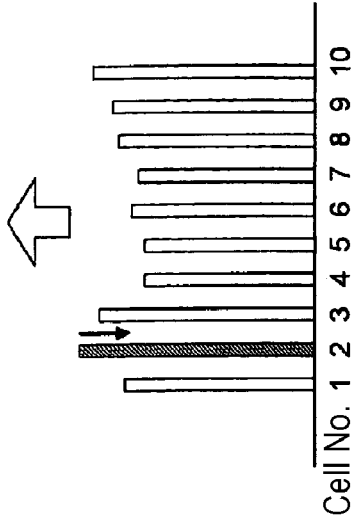
Figure 16D:
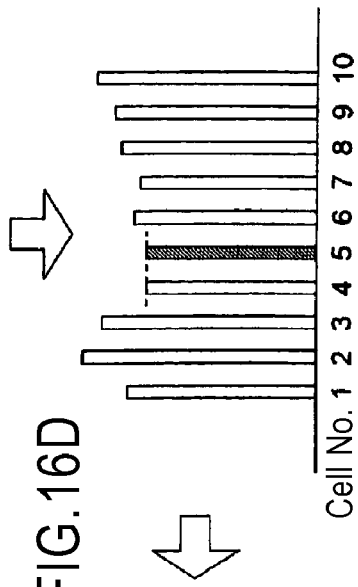

As shown in FIG. 16D, when the cell voltage of the cell 5 drops down to the cell voltage of the cell 4 whose cell voltage is lowest in the multiple cell battery, the control unit cancels the discharge path that is formed from the cell 5 to the electric motor 109. Then, in this state, the control unit controls ON/OFF of the switches in the discharge switch unit 111 such that the discharge path is formed from the cell 2 whose cell voltage is highest to the electric motor 109. When the discharge path is formed from the cell 2 to the electric motor 109, the cell voltage of the cell 2 drops down, as shown in FIG. 16E. The control unit keeps this discharge path until the cell voltage of the cell 2 drops down to the cell voltage of the cell 4 whose cell voltage is lowest in the multiple cell battery as shown in FIG. 16F.

In this manner, the control unit repeatedly performs the above discharge control, and repeatedly performs the switching control of the discharge path from each cell to the electric motor 109 until the respective cell voltages of the cells installed into the multiple cell battery finally reach the cell voltage of the cell 4 and such a condition is attained that there is no variation in the cell voltages.

Third Embodiment

A third embodiment is common to the second embodiment in that the discharge path is formed from one cell whose cell voltage is highest among the cells installed into the multiple cell battery 100 to the electric motor 109. But the timing at which the discharge path is switched is different from that in the second embodiment. In other words, in the second embodiment, the discharge is carried out until the cell voltage of the cell from which an electric power is discharged becomes equal to the cell voltage of the cell whose cell voltage is lowest in the multiple cell battery. In contrast, in the third embodiment, the discharge is carried out until the cell voltage of the cell from which an electric power is discharged becomes equal to a voltage that is obtained by subtracting a given voltage from the cell voltage of the cell whose cell voltage is second highest in the multiple cell battery.

A relationship between the multiple cell battery, a part of the electric drive system, and the accessories in the third embodiment is substantially similar to that shown in FIG. 1 in the first embodiment. But the control unit provided to the multiple cell battery in the third embodiment performs ON/OFF-control of the switches SW1 to SW2n, which is different from the control unit 121 in the first embodiment and the control unit in the second embodiment.

The discharge control performed by the control unit in the third embodiment will be described with reference to FIG. 17 and FIGS. 18A to 18F hereunder. FIG. 17 is a flowchart showing the discharge control performed by the control unit of the multiple cell battery in the third embodiment. FIGS. 18A to 18F are views showing an example of the cell voltages of the respective cells in the multiple cell battery of the third embodiment. In an example shown in FIGS. 18A to 18F, the multiple cell battery has 10 cells.

As shown in FIG. 17, in step S150, the control unit decides whether or not there is variation in the cell voltages of the cells installed into the multiple cell battery 100, based on the cell voltages of the respective cells obtained from the voltage detection units S1 to Sn. If there is variation in the cell voltages, a process goes to step S151. The control unit specifies the cell whose cell voltage, i.e., SOC is highest among the cells installed into the multiple cell battery. Then, in step S152, the control unit specifies the cell whose cell voltage is second highest among the cells installed into the multiple cell battery. Then, in step S153, the control unit ON/OFF-controls the switches of the discharge switch unit 111 such that the discharge path is formed from the cell which is specified in step S151 and whose cell voltage is highest to the electric motor 109.

When the discharge path is formed, an electric power is discharged from the cell specified in step S151 to the electric motor 109, and thus the cell voltage of the cell drops down. Then, in step S154, the control unit decides whether or not the cell voltage of the cell specified in step S151 is equal to a voltage obtained by subtracting a given voltage from the cell voltage of the cell specified in step S152 (referred to as a "reference voltage" hereinafter). When the cell voltage of the cell specified in step S151 drops down and becomes equal to the reference voltage, a process goes back to step S150.

Figure 18A:
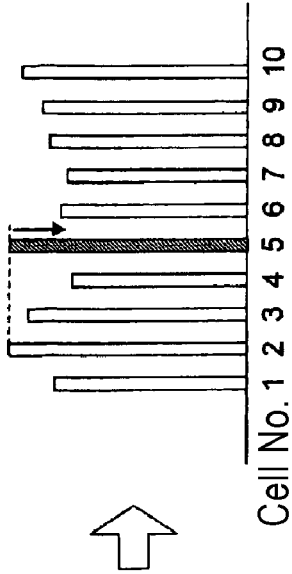
FIGS. 18A to 18F are views showing an example of cell voltages of the cells in the multiple cell battery of the third embodiment.

Then, the case where the discharge control based on the flowchart described with reference to FIG. 17 is applied to the multiple cell battery having the cell voltages shown in FIGS. 18A to 18F will be described hereunder. Firstly, when the cell voltages of the cells installed into the multiple cell battery are shifted from a state that there is no variation to a state that there is variation shown in FIG. 18A, the control unit controls ON/OFF of the switches of the discharge switch unit 111 such that the discharge path is formed from the cell 5 whose cell voltage is highest to the electric motor 109. When the discharge path is formed from the cell 5 to the electric motor 109, the cell voltage of the cell 5 drops down, as shown in FIG. 18A.

Figure 18B:
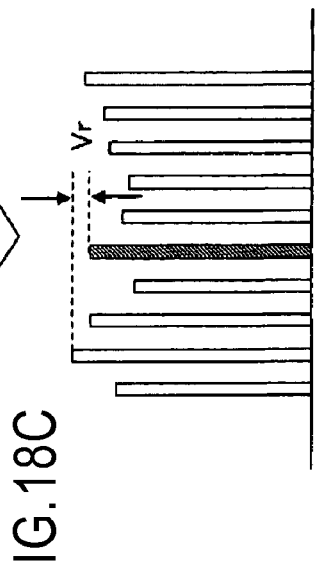
Figure 18C:
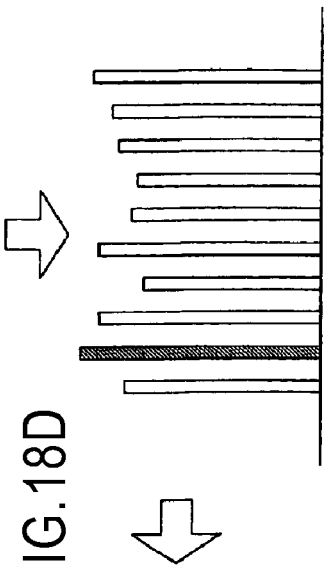

When the cell voltage of the cell 5 falls to the cell voltage of the cell 2 whose cell voltage is second highest in the multiple cell battery, as shown in FIG. 18B, and then falls to the reference voltage obtained by subtracting the given voltage Vr from the cell voltage of the cell 2, as shown in FIG. 18C, the control unit cancels the discharge path from the cell 2 to the electric motor 109. In this state, the control unit controls ON/OFF of the switches of the discharge switch unit 111 such that the discharge path is formed from the cell 2 whose cell voltage is highest to the electric motor 109.

Figure 18F:
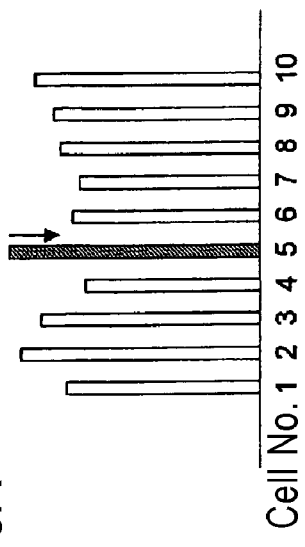
Figure 18E:
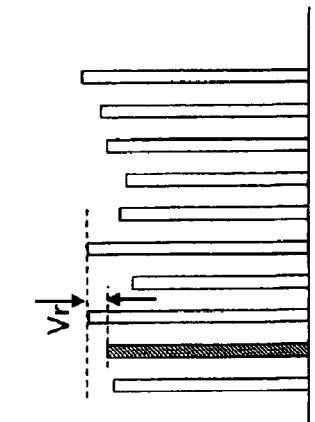
Figure 18D:
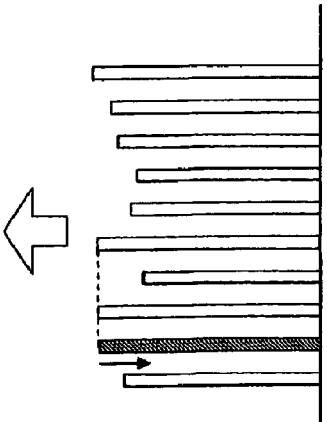

When the discharge path is formed from the cell 2 to the electric motor 109, the cell voltage of the cell 2 drops down. The control unit keeps this discharge path until the cell voltage of the cell 2 falls to the cell voltage of the cells 3 and 5 whose cell voltage is second highest in the multiple cell battery, as shown in FIG. 18E, and then falls to the reference voltage obtained by subtracting the given voltage Vr from the cell voltage of the cells 3 and 5, as shown in FIG. 18F.

In this manner, the control unit repeatedly performs the above discharge control, and repeatedly performs the switching control of the discharge path from each cell to the electric motor 109 until the respective cell voltages of the cells installed into the multiple cell battery finally reach the cell voltage of the cell 4 and such a condition is attained that there is no variation in the cell voltages.

Fourth Embodiment

Figure 19:
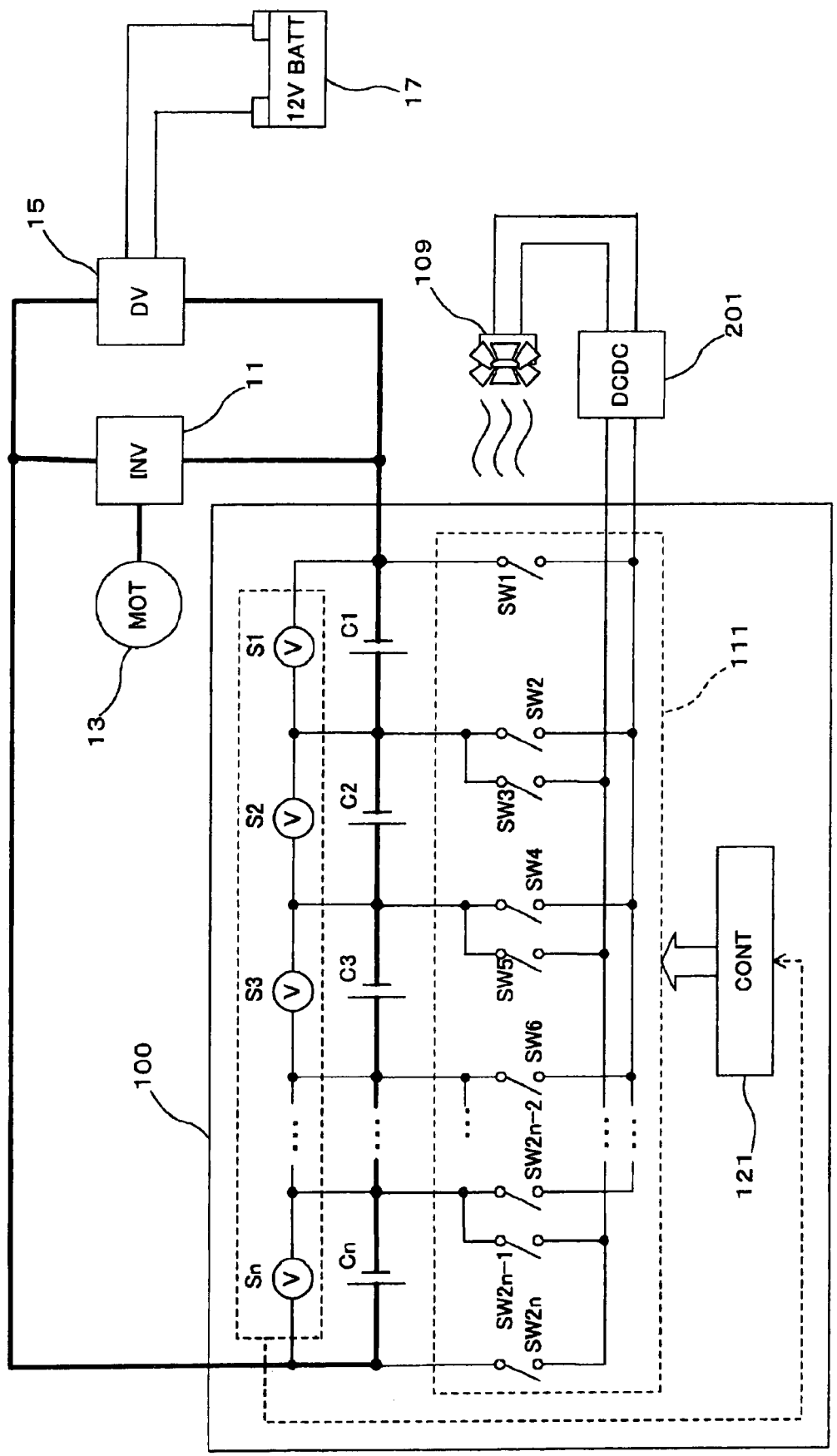
FIG. 19 is a block diagram showing a configuration in which a DC-DC converter is added to the vehicle shown in FIG. 1.

FIG. 19 is a block diagram showing a configuration in which a DC-DC converter is added to the vehicle shown in FIG. 1. The vehicle shown in FIG. 19 is equipped with the multiple cell battery 100, the inverter 11, the motor 13, the DC-DC converter 15, the battery 17, and the electric motor 109, all of which are described in the first embodiment, and a DC-DC converter 201. The DC-DC converter 201 steps up/down the discharge voltage of the multiple cell battery 100 to a desired voltage level. An increase/decrease level of the voltage by the DC-DC converter 201 is decided in accordance with the discharge voltage of the cell and the voltage required to drive the load typified by the electric motor 109. According to the present embodiment, the multiple cell battery is flexibly adaptable to the discharge voltage of the cell and the load drive voltage.

Fifth Embodiment

Figure 20:
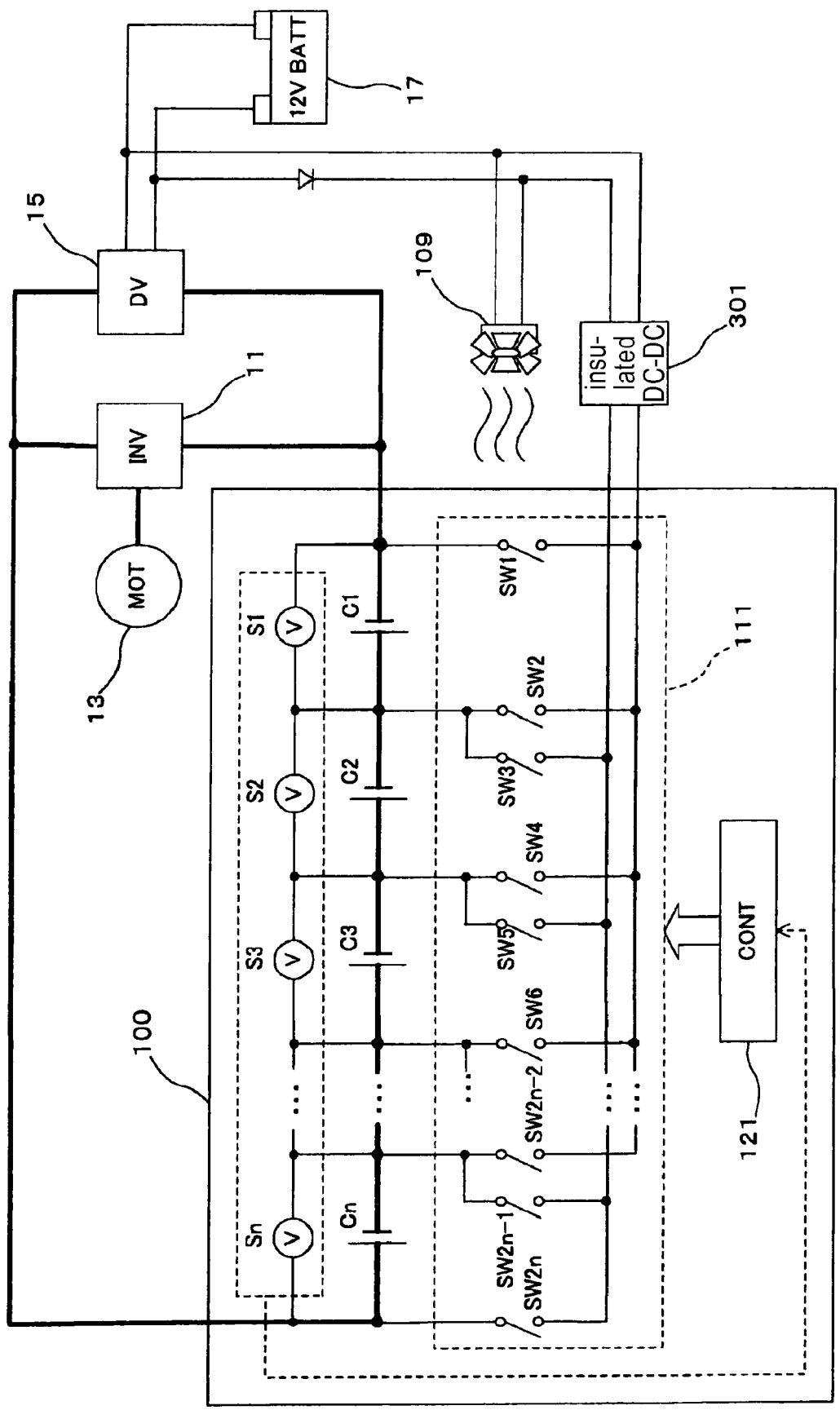
FIG. 20 is a block diagram showing a configuration in which an insulated DC-DC converter is added to the vehicle shown in FIG. 1.

FIG. 20 is a block diagram showing a configuration in which an insulated DC-DC converter is added to the vehicle shown in FIG. 1. The vehicle shown in FIG. 20 is equipped with the multiple cell battery 100, the inverter 11, the motor 13, the DC-DC converter 15, the battery 17, and the electric motor 109, all of which are described in the first embodiment, and an insulated DC-DC converter 301. In the present embodiment, an electric power can be supplied by not only the discharge of the cell in the multiple cell battery 100 but also the battery 17 to the electric motor 109. As shown in FIG. 20, the high-voltage multiple cell battery 100 and the battery 17 for the accessory voltage are connected electrically via the insulated DC-DC converter 301. Therefore, the multiple cell battery 100 and the battery 17 are never short-circuited.

Sixth Embodiment

Figure 21:
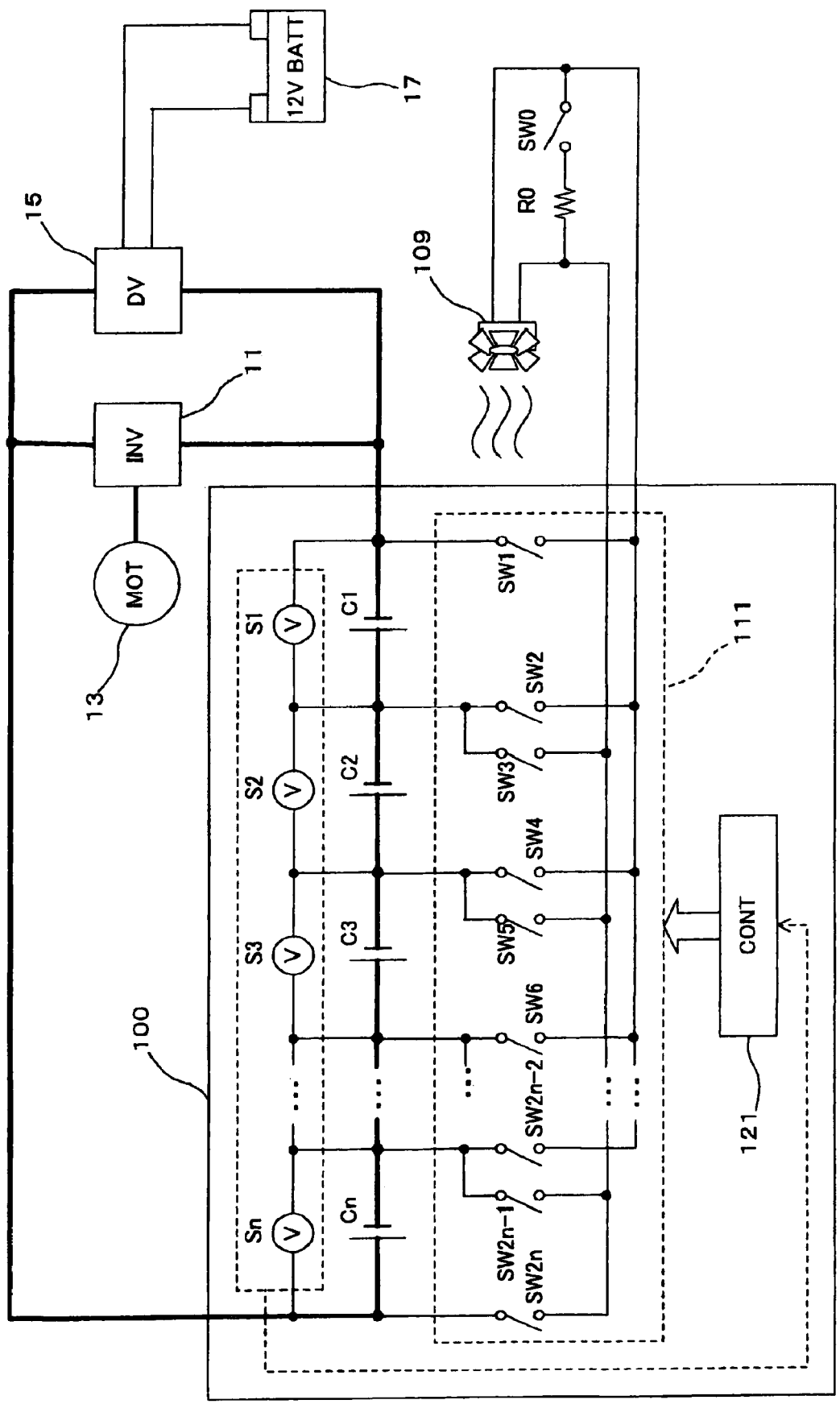
FIG. 21 is a block diagram showing a configuration in which a resistor and a switch are added to the vehicle shown in FIG. 1.

FIG. 21 is a block diagram showing a configuration in which a resistor and a switch are added to the vehicle shown in FIG. 1. The vehicle shown in FIG. 21 is equipped with the multiple cell battery 100, the inverter 11, the motor 13, the DC-DC converter 15, the battery 17, and the electric motor 109, all of which are described in the first embodiment, and a resistor R0 and a switch SW0. The resistor R0 and the switch SW0 are connected in series, and the resistor R0 and the switch SW0 are connected in parallel with the electric motor 109. The ON/OFF of the switch SW0 is controlled by the control unit 121 in the multiple cell battery 100. The control unit 121 turns ON the switch SW0 when the discharge voltage of the multiple cell battery 100 is below the voltage required to drive the electric motor 109.

For example, when the discharge is performed by only one cell, the discharge voltage of the multiple cell battery 100 does not reach the voltage that is required to drive the electric motor 109. Therefore, the electric motor 109 is not driven. At this time, the cell discharge due to the electric motor 109 is not performed. However, the resistor R0 is connected in parallel with the electric motor 109, and thus the discharge current flows through the resistor R0 when the control unit 121 turns ON the switch SW0. Therefore, even when the discharge voltage of the multiple cell battery 100 does not reach the voltage that is required to drive the electric motor 109, the cell discharge through the resistor R0 is performed.

In this case, a variable resistor may be used as the resistor R0 of the present embodiment. When the variable resistor may be used as the resistor R0, the control unit 121 controls a resistance value of the variable resistor in response to a level of the discharge voltage of the multiple cell battery 100. Also, such a mode may be employed that a plurality of sets of the resistor R0 and the switch SW0 are provided in parallel to give a different resistance value every set respectively. In this case, the control unit 121 closes the switch of the set that is chosen based on the level of the discharge voltage of the multiple cell battery 100.

Seventh Embodiment

Figure 22:
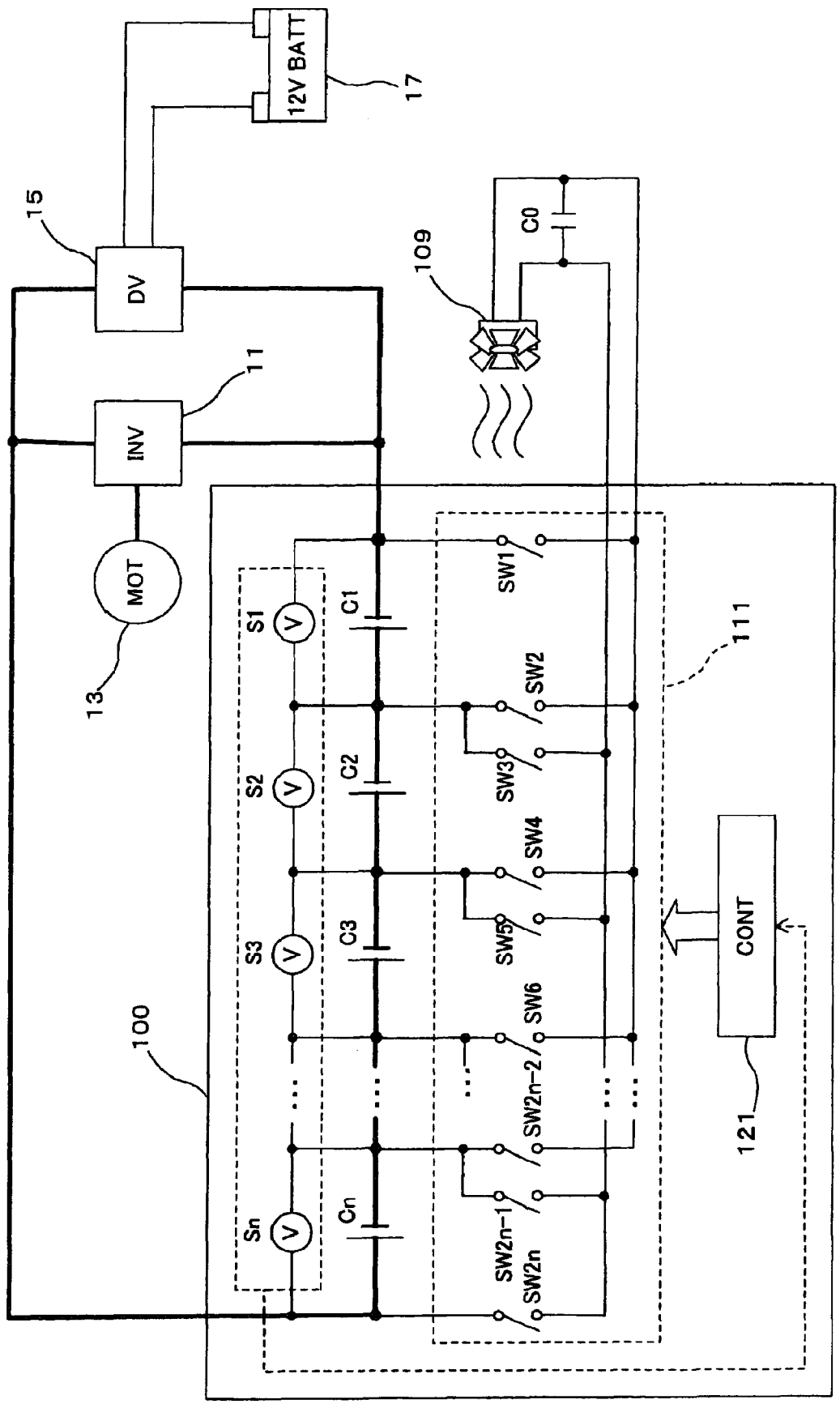
FIG. 22 is a block diagram showing a configuration in which a capacitor is added to the configuration in the vehicle shown in FIG. 1.

FIG. 22 is a block diagram showing a configuration in which a capacitor is added to the vehicle shown in FIG. 1. The vehicle shown in FIG. 22 is equipped with the multiple cell battery 100, the inverter 11, the motor 13, the DC-DC converter 15, the battery 17, and the electric motor 109, all of which are described in the first embodiment, and a capacitor C0. The capacitor C0 is connected in parallel with the electric motor 109. Therefore, the discharge voltage of the multiple cell battery 100 is applied across the capacitor C0. When the discharge voltage of the multiple cell battery 100 is 0 or when the discharge voltage of the multiple cell battery 100 is low, an electric energy accumulated in the capacitor C0 is supplied to the electric motor 109. As a result, even when the switches are switched by the control unit 121 of the multiple cell battery 100, an electric power can be supplied continuously to the electric motor 109 without instantaneous interruption of the power to the electric motor 109. Also, an electric power can be supplied stably to the electric motor 109 such that the power feed is not so affected by variation in level of the discharge voltage of the multiple cell battery 100.

While the present invention has been shown and described with reference to certain exemplary embodiments thereof, it will be understood by those skilled in the art that various changes in form and details may be made therein without departing from the spirit and scope of the invention as defined by the appended claims. It is aimed, therefore, to cover in the appended claim all such changes and modifications as fall within the true spirit and scope of the present invention.

What is claimed is:

1. A discharge controller for a multiple cell battery that has a plurality of storage cells connected in series with each other, a discharge path from said storage cell being connected to a load, said discharge controller comprising:

cell voltage detection units for detecting respective cell voltages of said storage cells;

a switch group comprising a plurality of switches each connected between said storage cells; and a control unit for performing ON/OFF control on the respective switches individually in response to detection results detected by the cell voltage detection units so as to form said discharge path from the storage cell to said load, wherein said storage cells are lithium-ion storage cells, the switch group comprises a first switch group comprising a plurality of first switches connected to a minus-side input terminal of said load, and a second switch group comprising a plurality of second switches connected to a plus-side input terminal of said load, the control unit turns ON any one of the first switches and any one of the second switches to form said discharge path from the successive storage cells to said load, the control unit assigns a storage cell whose cell voltage is highest among the storage cells to a first group so as to form a first discharge path from first storage cells assigned to the first group to said load, the control unit selects the first storage cells assigned to the first group such that discharge voltages of the first storage cells assigned to the first group is set within a voltage range in which said load is able to be driven, when another storage cell has the highest cell voltage among the storage cells as a result of discharge from the first storage cells assigned to the first group, the control unit assigns said another storage cell to a second group so as to form a second discharge path from second storage cells assigned to the second group to the load, and wherein when a load requiring a high driving voltage is connected to the cell battery, the control unit selects one or more of the first switches to be connected to the minus-side input terminal of said load such that the discharge voltages of the storage cells in the group match the high driving voltage of the load.

2. The discharge controller according to claim 1, wherein, when one of the first storage cells assigned to the first group is lowest among the storage cells in the multiple cell battery as a result of discharge from the first storage cells assigned to the first group, the control unit assigns another storage cell whose cell voltage is highest among the storage cells in the multiple cell battery to a third group so as to form a third discharge path from third storage cells assigned to the third group to the load.

3. The discharge controller according to claim 1, wherein the control unit does not select a group to which a storage cell having the lowest cell voltage among the storage cells in the multiple cell battery is assigned.

4. The discharge controller according to claim 1, further comprising:

a voltage converter for stepping up or down discharge voltages from the storage cells and provided on the discharge path.

5. The discharge controller according to claim 1, wherein the load is a rotary inductive load.

6. The discharge controller according to claim 1, wherein the multiple cell battery having the plurality of storage cells is used for feeding an electric power to a motor in an electric vehicle or a hybrid electrical vehicle.

7. The discharge controller according to claim 1, further comprising:

a resistor provided in parallel with said load; and a switch connected in parallel with said load and connected in series with the resistor, wherein the control unit performs ON/OFF control on the switch in response to the discharge voltages from the storage cells.

8. A discharge controller for a multiple cell battery that has a plurality of storage cells connected in series with each other, a discharge path from said storage cell being connected to a load, said discharge controller comprising:

cell voltage detection units for detecting respective cell voltages of said storage cells;

a switch group comprising a plurality of switches each connected between said storage cells; and a control unit for performing ON/OFF control on the respective switches individually in response to detection results detected by the cell voltage detection units so as to form said discharge path from the storage cell to said load, wherein said storage cells are lithium-ion storage cells, the switch group comprises a first switch group comprising a plurality of first switches connected to a minus-side input terminal of said load, and a second switch group comprising a plurality of second switches connected to a plus-side input terminal of said load, the control unit turns ON any one of the first switches and any one of the second switches to form said discharge path from the successive storage cells to said load, the control unit assigns a storage cell whose cell voltage is highest among the storage cells to a first group so as to form a first discharge path from first storage cells assigned to the first group to said load, the control unit selects the first storage cells assigned to the first group such that discharge voltages of the first storage cells assigned to the first group is set within a voltage range in which said load is able to be driven, when one of the first storage cells assigned to the first group is lowest among the storage cells in the multiple cell battery as a result of discharge from the first storage cells assigned to the first group, the control unit assigns another storage cell whose cell voltage is highest among the storage cells in the multiple cell battery to a third group so as to form a third discharge path from third storage cells assigned to the third group to the load, and wherein when a load requiring a high driving voltage is connected to the cell battery, the control unit selects one or more of the first switches to be connected to the minus-side input terminal of said load such that the discharge voltages of the storage cells in the group match the high driving voltage of the load.

9. The discharge controller according to claim 8, wherein the control unit does not select a group to which a storage cell having the lowest cell voltage among the storage cells in the multiple cell battery is assigned.

10. The discharge controller according to claim 8, further comprising:

a voltage converter for stepping up or down discharge voltages from the storage cells and provided on the discharge path.

11. The discharge controller according to claim 8, wherein the load is a rotary inductive load.

12. The discharge controller according to claim 8, wherein the multiple cell battery having the plurality of storage cells is used for feeding an electric power to a motor in an electric vehicle or a hybrid electrical vehicle.

13. The discharge controller according to claim 8, further comprising:

a resistor provided in parallel with said load; and a switch connected in parallel with said load and connected in series with the resistor, wherein the control unit performs ON/OFF control on the switch in response to the discharge voltages from the storage cells.

\* \* \* \* \*